United States Patent
Maddux et al.

(10) Patent No.: US 7,519,534 B2
(45) Date of Patent: Apr. 14, 2009

(54) SPEECH CONTROLLED ACCESS TO CONTENT ON A PRESENTATION MEDIUM

(75) Inventors: Scott Lynn Maddux, San Francisco, CA (US); Adam Jordan, Oakland, CA (US); Jody Williams, San Carlos, CA (US); Harry W. Printz, San Francisco, CA (US)

(73) Assignee: AgileTV Corporation, Menlo Park, CA (US)

( * ) Notice: Subject to any disclaimer, the term of this patent is extended or adjusted under 35 U.S.C. 154(b) by 840 days.

(21) Appl. No.: 10/699,543

(22) Filed: Oct. 30, 2003

(65) Prior Publication Data

US 2004/0193426 A1 Sep. 30, 2004

Related U.S. Application Data

(60) Provisional application No. 60/483,268, filed on Jun. 26, 2003, provisional application No. 60/422,561, filed on Oct. 31, 2002.

(51) Int. Cl.
*G10L 15/00* (2006.01)
*G10L 15/22* (2006.01)

(52) U.S. Cl. .................. 704/255; 704/270; 704/275

(58) Field of Classification Search ........... 704/275, 704/251, 255, 257, 270
See application file for complete search history.

(56) References Cited

U.S. PATENT DOCUMENTS

| | | | | |
|---|---|---|---|---|
| 5,752,232 | A * | 5/1998 | Basore et al. | 704/275 |
| 5,774,859 | A * | 6/1998 | Houser et al. | 704/275 |
| 6,130,726 | A * | 10/2000 | Darbee et al. | 348/734 |
| 6,298,324 | B1 * | 10/2001 | Zuberec et al. | 704/251 |
| 6,301,560 | B1 * | 10/2001 | Masters | 704/251 |
| 6,320,947 | B1 | 11/2001 | Joyce | |

(Continued)

FOREIGN PATENT DOCUMENTS

EP 1341363 9/2003

(Continued)

*Primary Examiner*—Martin Lerner
(74) *Attorney, Agent, or Firm*—Michael A. Glenn; Glenn Patent Group

(57) ABSTRACT

One embodiment of the invention provides television viewers with an intuitive and easy-to-use way to find the programs they want and to control their television viewing experience. In a further embodiment, a speech control interface, in combination with a variety of search functions, is provided such that television viewers have an intuitive and easy-to-use way to find the programs and information they want. The invention also provides the use of personalization as a way to filter and deliver relevant content and services to users based upon individual preferences. Another aspect of the invention provides a hierarchical user interface for speech-controlled, interactive applications, that gives television viewers an intuitive and easy-to-use way to find the programs they want and to control their television viewing experience. The invention also provides a method and apparatus where the channel lineup in a television service is dynamic and changeable, i.e. the list of available channels can be modified, in real time, to suit the preferences and usage of a particular subscriber. Further, the invention provides a method and apparatus that addresses the use of speaker, group, language, or emotional state identification systems to target advertising, to users who are or are not enrolled in a speaker ID system.

7 Claims, 19 Drawing Sheets

U.S. PATENT DOCUMENTS

| | | | |
|---|---|---|---|
| 6,374,177 B1 | 4/2002 | Lee | |
| 6,374,226 B1 * | 4/2002 | Hunt et al. | 704/275 |
| 6,381,316 B2 | 4/2002 | Joyce | |
| 6,408,272 B1 * | 6/2002 | White et al. | 704/270.1 |
| 6,415,257 B1 * | 7/2002 | Junqua et al. | 704/275 |
| 6,658,414 B2 | 12/2003 | Bryan | |
| 6,711,543 B2 | 3/2004 | Cameron | |
| 6,714,632 B2 | 3/2004 | Joyce | |
| 6,721,633 B2 | 4/2004 | Funk | |
| 6,725,022 B1 | 4/2004 | Clayton | |
| 6,728,531 B1 | 4/2004 | Lee | |
| 6,799,201 B1 | 9/2004 | Lee | |
| 6,892,083 B2 | 5/2005 | Shostak | |
| 6,901,366 B1 * | 5/2005 | Kuhn et al. | 704/275 |
| 6,975,993 B1 * | 12/2005 | Keiller | 704/275 |
| 6,985,865 B1 * | 1/2006 | Packingham et al. | 704/275 |
| 7,020,609 B2 * | 3/2006 | Thrift et al. | 704/270.1 |
| 7,113,981 B2 | 9/2006 | Slate | |
| 7,117,159 B1 * | 10/2006 | Packingham et al. | 704/275 |
| 7,188,066 B2 * | 3/2007 | Falcon et al. | 704/275 |
| 7,203,645 B2 * | 4/2007 | Pokhariyal et al. | 704/251 |
| 7,324,947 B2 * | 1/2008 | Jordan et al. | 704/275 |
| 2001/0019604 A1 | 9/2001 | Joyce | |
| 2002/0015480 A1 | 2/2002 | Daswani | |
| 2002/0032564 A1 * | 3/2002 | Ehsani et al. | 704/235 |
| 2002/0049535 A1 | 4/2002 | Rigo | |
| 2002/0106065 A1 | 8/2002 | Joyce | |
| 2002/0146015 A1 | 10/2002 | Bryan | |
| 2003/0004728 A1 * | 1/2003 | Keiller | 704/275 |
| 2003/0028380 A1 | 2/2003 | Freeland | |
| 2003/0033152 A1 | 2/2003 | Cameron | |
| 2003/0065427 A1 | 4/2003 | Funk | |
| 2003/0068154 A1 | 4/2003 | Zylka | |
| 2003/0073434 A1 | 4/2003 | Shostak | |
| 2003/0093281 A1 * | 5/2003 | Geilhufe et al. | 704/275 |
| 2003/0177013 A1 * | 9/2003 | Falcon et al. | 704/275 |
| 2004/0077334 A1 | 4/2004 | Joyce | |
| 2004/0110472 A1 | 6/2004 | Witkowski | |
| 2004/0127241 A1 | 7/2004 | Shostak | |
| 2004/0132433 A1 | 7/2004 | Stern | |
| 2005/0143139 A1 | 6/2005 | Park | |
| 2005/0144251 A1 | 6/2005 | Slate | |
| 2005/0170863 A1 | 8/2005 | Shostak | |
| 2006/0018440 A1 | 1/2006 | Watkins | |
| 2006/0050686 A1 | 3/2006 | Velez-Rivera | |
| 2006/0085521 A1 | 4/2006 | Sztybel | |
| 2006/0206339 A1 | 9/2006 | Silvera | |
| 2006/0206340 A1 | 9/2006 | Silvera | |

FOREIGN PATENT DOCUMENTS

| | | |
|---|---|---|
| EP | 1003018 | 5/2005 |
| EP | 1633150 | 3/2006 |
| EP | 1633151 | 3/2006 |
| EP | 1742437 | 1/2007 |
| WO | WO00/16568 | 3/2000 |
| WO | WO00/21232 | 4/2000 |
| WO | WO01/22112 | 3/2001 |
| WO | WO01/22249 | 3/2001 |
| WO | WO01/22633 | 3/2001 |
| WO | WO01/22712 | 3/2001 |
| WO | WO01/22713 | 3/2001 |
| WO | WO01/39178 | 5/2001 |
| WO | WO01/57851 | 8/2001 |
| WO | WO02/07050 | 1/2002 |
| WO | WO02/11120 | 2/2002 |
| WO | WO02/17090 | 2/2002 |
| WO | WO02/097590 | 12/2002 |
| WO | WO2004/021149 | 3/2004 |
| WO | WO2004/077721 | 9/2004 |
| WO | WO2005/079254 | 9/2005 |
| WO | WO2006/029269 | 3/2006 |
| WO | WO2006/033841 | 3/2006 |
| WO | WO2006/098789 | 9/2006 |

\* cited by examiner

PROGRAM INFORMATION GRAMMAR ─╱─30

| UTTERANCE | ATTRIBUTE | LINKED GRAMMAR |
|---|---|---|
| "ROBERT REDFORD" | ACTOR TYPE | ROBERT REDFORD |
|  | CHAINED COMMAND | PROGRAMS GRAMMAR |
| ETC. | ETC. | ETC. |
| ETC. | ETC. |  |

ROBERT REDFORD PROGRAMS GRAMMAR ─╱─32

| UTTERANCE | ATTRIBUTE | LINKED GRAMMAR |
|---|---|---|
| "BUTCH CASSIDY" | PROGRAM TYPE | NONE |
| "THREE DAYS OF THE CONDOR" | PROGRAM TYPE | NONE |
| ETC. | ETC. | ETC. |
| ETC. |  | ETC. |

FIG. 3

PROGRAM INFORMATION GRAMMAR ─╱─30

| UTTERANCE | ATTRIBUTE | LINKED GRAMMAR |
|---|---|---|
| "ROBERT REDFORD" | ACTOR TYPE | NONE |
| ETC. | ETC.. | ETC. |

FIG. 4

SPEECH CONTROLLED ACCESS TO CONTENT ON A PRESENTATION MEDIUM

This application claims priority and incorporates by reference the Provisional Application No. 60/422,561, filed Oct. 31, 2002 and the Provisional Application No. 60/483,268, filed Jun. 26, 2003.

BACKGROUND OF THE INVENTION

1. Technical Field

The invention relates to user access to content. More particularly, the invention relates to speech controlled access to content on a presentation medium.

2. Description of the Prior Art

In recent years, the number of channel and program choices for cable and digital broadcast satellite subscribers has grown to the point where the television viewer is faced with a vast array of programming options. The breadth of service providers and depth and variety of content has made it more difficult for the television viewer to find the programs they want to watch. In the face of this challenge, the television viewing experience remains anchored in passive simplicity.

It would be advantageous to provide television viewers with an intuitive and easy-to-use way to find the programs they want and to control their television viewing experience.

It would also be advantageous to provide a speech control interface, in combination with a variety of search functions, such that television viewers have an intuitive and easy-to-use way to find the programs and information they want.

It would also be advantageous to provide the use of personalization as a way to filter and deliver relevant content and services to users based on individual preferences.

It would also be advantageous to provide a hierarchical user interface for speech-controlled, interactive applications, that gives television viewers an intuitive and easy-to-use way to find the programs they want and to control their television viewing experience.

Another problem exists in existing digital cable systems, where the channels that are available to watch in full screen TV and the program guide (the "channel lineup") are fixed and non-changing, assuming that the channel lineup itself does not change. In current systems, when the channel up and down buttons are pressed, the user navigates through all channels of the entire channel lineup.

It would be further advantageous for the channel lineup to be dynamic and changeable, i.e. the list of available channels can be modified, in real time, to suit the preferences and usage of a particular subscriber.

There is also substantial prior art in the design of speech recognition systems, and in systems that identify the speaker, group, language, or emotional state associated with a given speech sample. There is also substantial prior art in selecting an advertising medium or vehicle to target a desired segment of the population.

It would be advantageous to provide a method and apparatus that addresses the use of speaker, group, language, or emotional state identification systems to target advertising, to users who are enrolled in a speaker ID system, by virtue of having previously supplied a voice sample to the system, or to users who are not so enrolled.

SUMMARY OF THE INVENTION

One embodiment of the invention provides television viewers with an intuitive and easy-to-use way to find the programs they want and to control their television viewing experience. In a further embodiment, a speech control interface, in combination with a variety of search functions, is provided such that television viewers have an intuitive and easy-to-use way to find the programs and information they want. The invention also provides the use of personalization as a way to filter and deliver relevant content and services to users based upon individual preferences. Another aspect of the invention provides a hierarchical user interface for speech-controlled, interactive applications, that gives television viewers an intuitive and easy-to-use way to find the programs they want and to control their television viewing experience. The invention also provides a method and apparatus where the channel lineup in a television service is dynamic and changeable, i.e. the list of available channels can be modified, in real time, to suit the preferences and usage of a particular subscriber. Further, the invention provides a method and apparatus that addresses the use of speaker, group, language, or emotional state identification systems to target advertising, to users who are or are not enrolled, by virtue of having previously provided a voice sample to the system.

BRIEF DESCRIPTION OF THE DRAWINGS

FIG. 3 is a block schematic diagram that shows the use of explicit linked navigation paths according to the invention;

FIG. 4 is a block schematic diagram that shows the use of implicit linked navigation paths according to the invention;

DETAILED DESCRIPTION OF THE INVENTION

Figure 1:
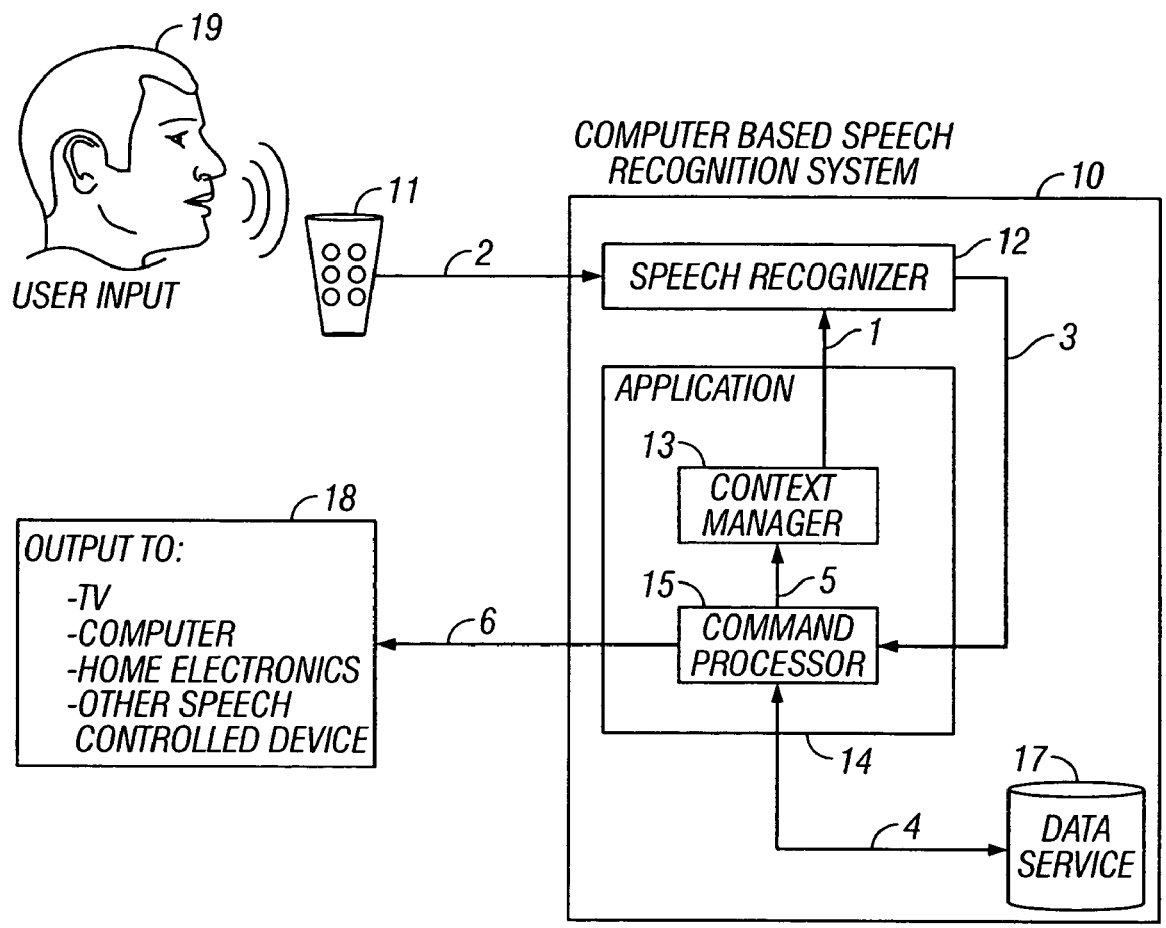
FIG. 1 is a block schematic diagram that shows a speech controlled application environment according to the invention.

One embodiment of the invention provides television viewers with an intuitive and easy-to-use way to find the programs they want and to control their television viewing experience. In a further embodiment, a speech control interface, in combination with a variety of search functions, is provided such that television viewers have an intuitive and easy-to-use way to find the programs and information they want. The invention also provides the use of personalization as a way to filter and deliver relevant content and services to users based upon individual preferences. Another aspect of the invention provides a hierarchical user interface for speech-controlled, interactive applications, that gives television viewers an intuitive and easy-to-use way to find the programs they want and to control their television viewing experience. The invention also provides a method and apparatus where the channel lineup in a television service is dynamic and changeable, i.e. the list of available channels can be modified, in real time, to suit the preferences and usage of a particular subscriber. Further, the invention provides a method and apparatus that addresses the use of speaker, group, language, or emotional state identification systems to target advertising, to users who are or are not enrolled in a speaker ID system by virtue of having previously supplied a voice sample to the system (see below).

The foregoing embodiments of the invention are discussed in detail below:

Speech-optimized Information Architecture for Interactive Applications

This embodiment of the invention provides a method for constructing grammars for speech-controlled, interactive applications that provides television viewers with an intuitive and easy-to-use way to find the programs they want and to control their television viewing experience. An interactive application is one in which more than one party is an active participant. For this embodiment, one of the parties is human and the other is a software application. There are various publications describing how to construct a grammar, available from the VoiceXML Forum and other sources.

Grammars place constraints on the sequence of words allowed in utterances, which improves recognition performance. The number of words and phrases that are used to describe, for example, television-related content is so large that they must be carefully organized to give users high recognition accuracy when making verbal requests to control their television sets or to search for television-related information. This embodiment of the invention organizes the grammars in a way that provides high recognition accuracy for utterances from a large and continually expanding set of words and phrases. It does this without requiring users to provide samples of their voices ahead of time to train the system.

The information space is organized by information type, such as actor or TV program for television-related content. The following discussion describes how these information types can be used to create a scalable, flexible basis for developing interactive speech-controlled applications. The information architecture allows information to be linked or organized into a hierarchy, and gives the application access to the path that the user chose to navigate through the information. The information in the grammars can also be used to carry out requests initiated by buttons on a remote control or other such device.

Each speech-controlled application uses a set of commands initiated by either speech or input from a more traditional device, such as a remote control or pointing device. Speech commands are specified in a set of grammars. For the purposes of this discussion, grammars contain a set of items. Each item contains a word or phrase that can be spoken, an associated set of attributes that provide more information about the item, and optionally, the name of a grammar that must be imported to complete the utterance. A grammar also has an associated set of attributes that provide more information about the grammar as a whole.

Grammars that are largely composed of utterances that are used to control an application are referred to as command grammars in the rest of this disclosure, and grammars that contain multiple alternatives for a single piece of information, such as a set of actor names, are referred to as information-type specific grammars.

An information-type specific grammar may be linked to another grammar via a unique utterance, referred to as a keyword, that distinguishes this information type from any other. These grammars have an attribute that specifies this keyword, and the items in the grammar contain an attribute that identifies the item's information type.

Some speech commands may be chained together to provide one-step access to information or application functionality. The Chained Command attribute indicates that the utterance in an item is a part of a chained command. The Chained Command attribute may appear in both command and information-type specific grammars.

The keywords used to chain grammars together should be acoustically distinct. That is, the keywords should not sound similar to other keywords or other utterances in the grammars. The more distinct they are, the better recognition accuracy is.

FIG. 1 shows the application 14 environment 10. The numbered steps shown in FIG. 1 are as follows:

1. The Context Manager 13 tells the Recognizer 12 to activate the appropriate grammars for the current context.
2. The user 19 speaks a command, in this example, into a microphone 11.
3. The Recognizer 12 returns the spoken command and all associated attributes to the Command Processor 15.
4. The Command Processor 15 consults a Data Source 17, if necessary, to carry out the command.
5. The Command Processor 15 updates the current context.
6. The results of the command are output 18 to be shown to the user.

Note that user input may also be received from a pointing device or remote control.

In these cases, the input goes directly to the Command Processor. In this embodiment, Steps 4 through 6 complete the processing of the command.

Grammars constructed using this information architecture enable easy access to information hierarchies, allow multiple linked navigation paths, and facilitate the development of more flexible applications.

Hierarchy

Grammars can be linked into a hierarchy as follows:

An utterance that links two grammars is defined in the grammar in two parts. The first part is a keyword, for information-type specific grammars, or a command for command grammars. The contents of the grammar-to-be-linked are imported to include all of the alternatives for the second part of the utterance. As long as the keyword or command is not one of the items in the higher-level grammar, this ensures that linking the two grammars does not significantly degrade recognition accuracy.

Application Example

Figure 2:
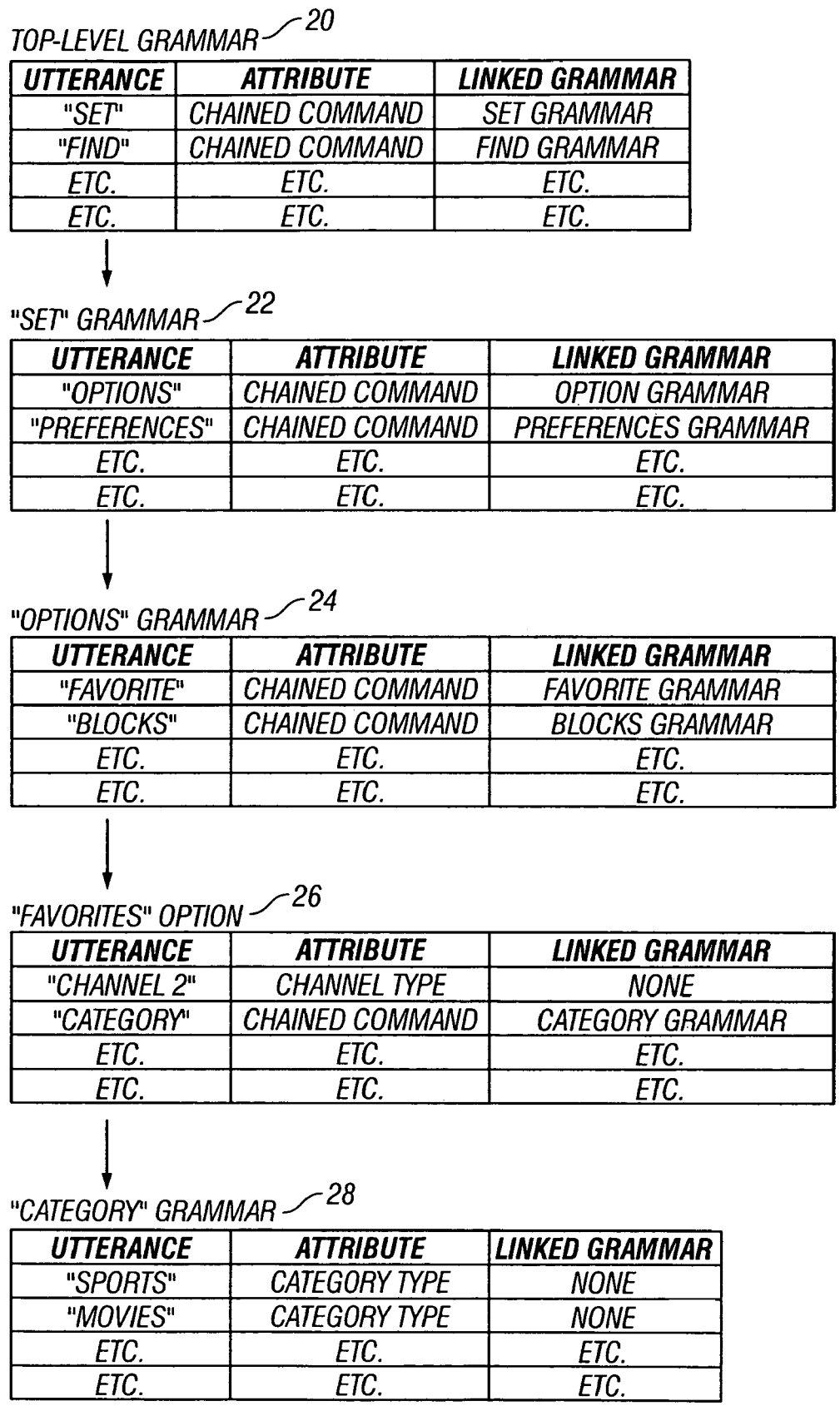
FIG. 2 is a block schematic diagram that shows the use of chained grammars to give users one-step access to application functionality according to the invention.

Application writers can chain grammars together to give users one-step access to application functionality. This is shown in FIG. 2. In this example, users can say "Set Options Favorite Channel 2" or "Set Options Favorite Category Sports" to change the setting in a single step. The user utterances invoke a top-level grammar 20 which links to a "Set" grammar 22, which links to an "Options" grammar 24, which links to a "Favorites" grammar 26, which links to a "Category" grammar. Thus, the values returned from the Recognizer in the first case are:

"Set", Chained Command, "Options", Chained Command, "Favorite", Chained Command, "Channel 2", Channel Type. The values returned in the second case are: "Set", Chained Command, "Options", Chained Command, "Favorite", Chained Command, "Category"Chained Command, "Sports", Category Type.

Linked Navigation Paths

Grammars can link information-type specific information either explicitly or implicitly.

An application can predetermine the navigation path and link in all of the appropriate grammars. This is shown in FIG. 3, where the program information grammar 30 links the utterance "Robert Redford" to the "Robert Redford" programs grammar 32.

The application may also rely on the type attributes returned by the recognizer to determine which options to make available to the user next, as in FIG. 4.

The grammars shown in FIGS. 3 and 4 are composed of actor names, director names, and other program-related information that appears in program description information.

Application Example

The grammar in FIG. 4 does not specify what information the user wants about "Robert Redford." In this case, the application determines which action to take based on the application context and the results returned from the recognizer. The application flow through FIG. 1 for this example is as follows:

1. The Content Manager tells the Recognizer to activate the Program Information grammar.
2. The user says "Robert Redford."
3. The Recognizer passes "Robert Redford" and Actor Type to the Command Processor.
4. The Command Processor decides to get Robert Redford movies from a Data Source.
5. A list of Robert Redford movies is displayed to the user.

This approach can also be used to support the "more like this" command. The recognizer returns "more like this," and the application uses the currently selected item type to decide where to look for the information that the user wants.

Flexible Application Structure

This information architecture of the presently preferred embodiment can be used, for example, in two different ways to extend existing applications with minimal development effort.

First, some of the user interface for an application can be built dynamically from the data in the grammars. The grammars contain the structure of the speech commands for the application, and indicate when commands are chained. Grammars may be parsed to obtain this structure and the structure may be used to auto-generate some of the user interface for the application.

Second, it is easy to extend the content accessible via the application. A new link can easily be added to any of the chained commands.

Other Information

This invention has been reduced to practice via implementation in C-code, XML grammar files, compilation, and the generation of executable images for the AgileTV engine (AgileTV, Menlo Park, Calif.) to implement a very simple program name search. The program name keyword was added to a command grammar in an existing application, and the name of every program on the Palo Alto, Calif. cable television system in a two-week period was added to a program-specific grammar. The program-specific grammar contained approximately 7000 utterances, and recognition accuracy for the application as a whole was not significantly affected.

The method and system described above also has application in support of the following services:

Targeted Search
Exploratory Search
Dynamic Application Generation

Speech Controlled Search

This embodiment of the invention provides a speech control interface in combination with a variety of search functions which provide television viewers with an intuitive and easy-to-use way to find the programs and information they want. Users typically search and/or discover new programs in one of two ways:

Exploratory Search—This search method is used when the television viewer is looking for something without a specific program or criteria in mind. The exploratory search methods support a more free-form type of discovery.

Targeted (or specifically directed) Search—This search method is used when the television viewer is looking for a particular item (program, movie, etc.) based on a specific attribute, such as sports team, actor, director, name, etc.

The specific method described in this document is designed to provide a simple user experience and maintain high recognition accuracy for the speech control interface.

Exploratory Search

Exploratory search is a method by which the user can find additional data with similar attributes to an already known piece of data. Within the space of television-related information, exploratory search allows users to find other programs related in some manner to a currently-selected program, such as finding more movies starring the same actor who is in a movie that the user is currently watching. This type of searching affords more free-form discovery, in that specific information types and items may not be known prior to the search. Exploratory searches are controlled with hierarchical or chained speech commands, or on-screen buttons. Results from exploratory searches are displayed in a list on the television screen.

Exploratory searches may be controlled explicitly or implicitly.

In an explicit exploratory search, the user specifies a particular information type by which the search should be performed. For example, while watching a movie on television, the user may ask for other movies by the same director using the appropriate speech command, e.g. "Ron Howard." A list of movies by that particular director is then displayed in an on-screen list. Alternatively, while in the program guide, the user may ask to see other programs starring the same actor as is in the selected program.

Information types for explicit searches of television programs include, but are not limited to: Actor, Director, Writer, Creator, Episode, Date, Popularity (Nielsen), Quality (Editorial/Star Ratings).

In an implicit exploratory search, the user asks for more data related to the currently selected data. The specific information types are determined programmatically by the search application. For example, if program information for a movie is displayed, and the user performs an implicit exploratory search using the appropriate command, e.g. "more like this," the search application finds other movies with similar information items, such as the same genre, director, or actors.

Another example of an exploratory search is a search that is based on recommendations. This search method is used when the television viewer chooses to rely on a trusted source for a recommendation, e.g. Ebert & Roeper's two-thumbs-up selections or The American Film Institute's Top 100 movies.

Targeted Search Criteria

Targeted search is a method by which the user can find specific data, such as program names and movie titles, according to particular criteria. Within the space of television-related information, targeted search allows users to find specific programs according to attributes of those programs. Using a Speech-Optimized Information Architecture and Hierarchical Speech UI (as described herein), the user initiates a targeted search by specifying an information type and one or more items of that type. The targeted search then returns programs that match the specified item or items in a list that is displayed on the television screen. The control of targeted search may be accomplished through both one-step, chained speech commands, as well as by progressive multi-step speech commands and on-screen buttons.

A targeted search may be performed on any data that belongs to one or more information types. Within the television space, information types include, but are not limited to: program name, genre, actor, director, writer, episode, date, popularity (Nielsen), quality (editorial, star rating), and subject matter rating (MPAA ratings and TV Ratings).

Using the Hierarchical Speech UI, targeted search is modeless, ubiquitous, and always accessible. It can be performed in any mode and on any screen. For example, if the user wants to see if any movies starring Mel Gibson are airing in the evening, the targeted search may be initiated while watching TV or in any screen in the program guide using the appropriate command, e.g. "Find Actor Mel Gibson." Additionally, if the user wishes, targeted search may also be controlled through progressive search modes and screens that do not require the memorization of any commands or keywords.

Embodiments

Hierarchical Speech User Interface. When the search application is built on the hierarchical speech user interface, it provides modeless, ubiquitous one-step access to information content.

Speech-Optimized Information Architecture. This architecture organizes information content for flexible, intuitive access with high recognition accuracy.

Data Sources. A search can be built on any data source as long as information type information can be extracted. Exemplary data sources include:

Tribune Media Services.

Internet-based services, such as www.IMDB.com and www.allmusic.com.

Proprietary services such as Video on Demand databases.

Other, e.g. walled garden, news, editorial, etc.

Illustration of Exploratory Search Functionality

Figure 5:
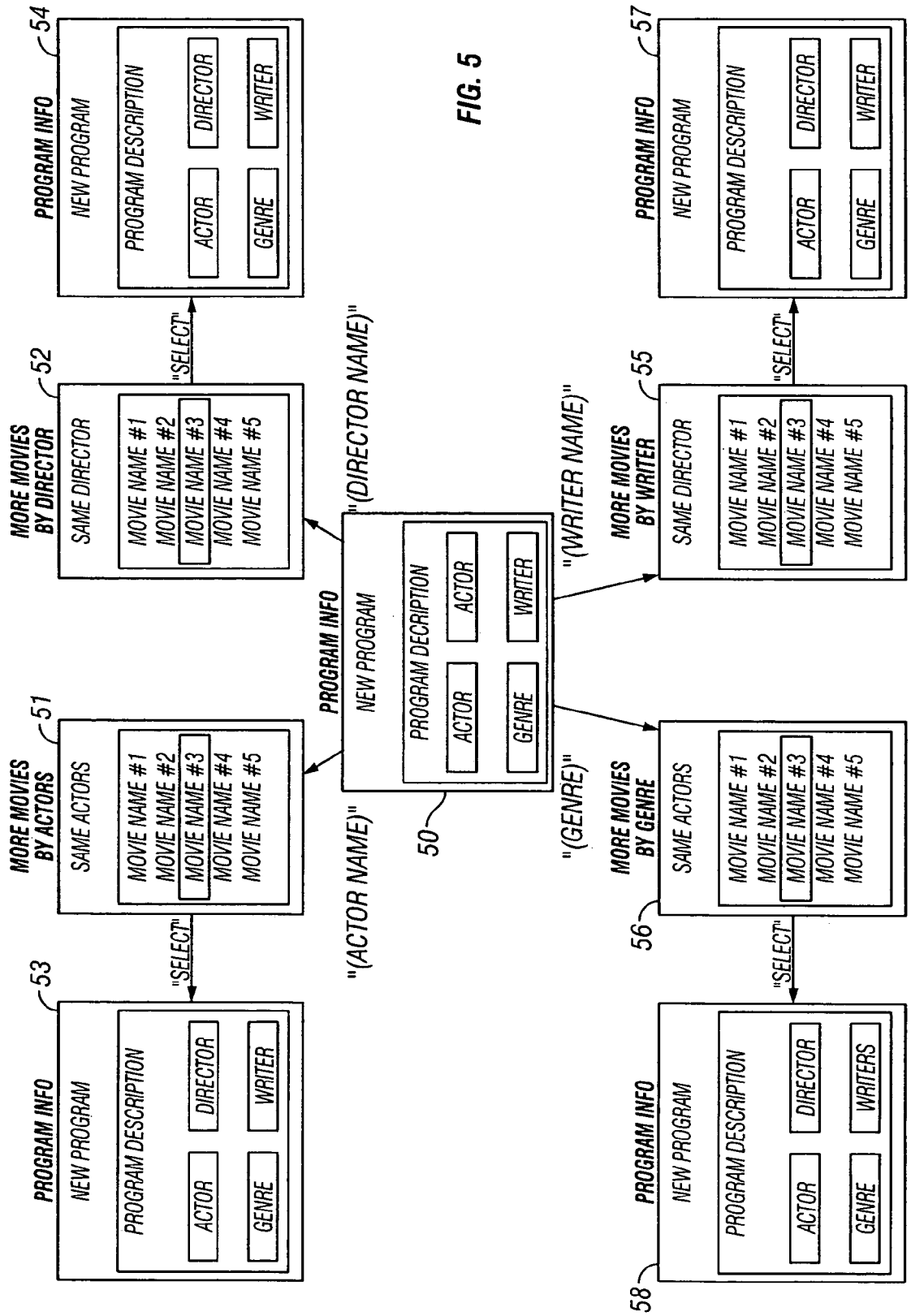
FIG. 5 is a block schematic diagram which shows exploratory search functionality according to the invention.

FIG. 5 is a block schematic diagram which shows exploratory search functionality. As shown in FIG. 5, a user begins at an initial program information screen 50. The user can explore directors 52 by entering a director name, and can retrieve program information on a particular movie 54 from a listing of movies made by that director. Likewise, the user may explore by actor name 51, 53; genre 56, 58; and writer name 55, 57. Those skilled in the art will appreciate that other categories may be provided as desired.

Example

1. Initial program information screen 50.
2. User initiates exploratory search (explicitly controlled) by asking for more movies by the same director 52.
3. Application shows list of movies by director 54.
4. User selects search result.
5. Application shows new program information screen.

Illustrations of Targeted Search Functionality

Figure 6:
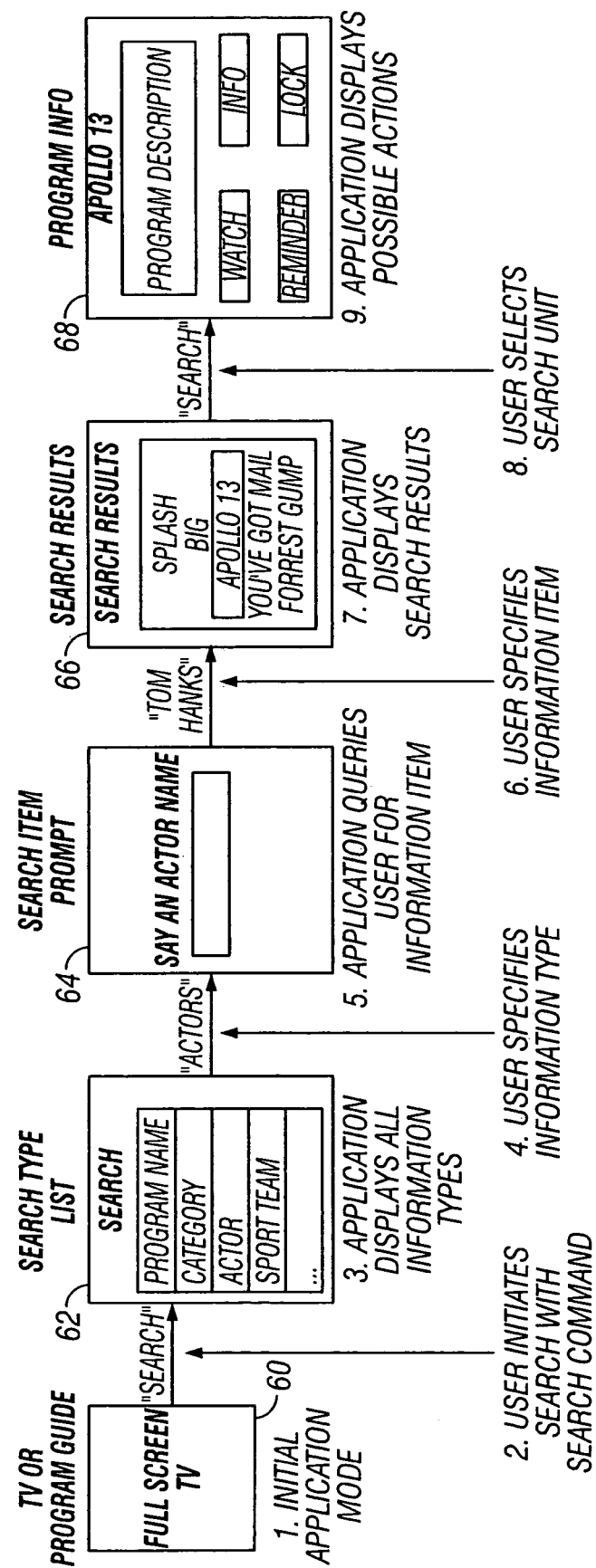
FIG. 6 is a block schematic diagram which shows step-by-step targeted search functionality according to the invention.
Figure 7:
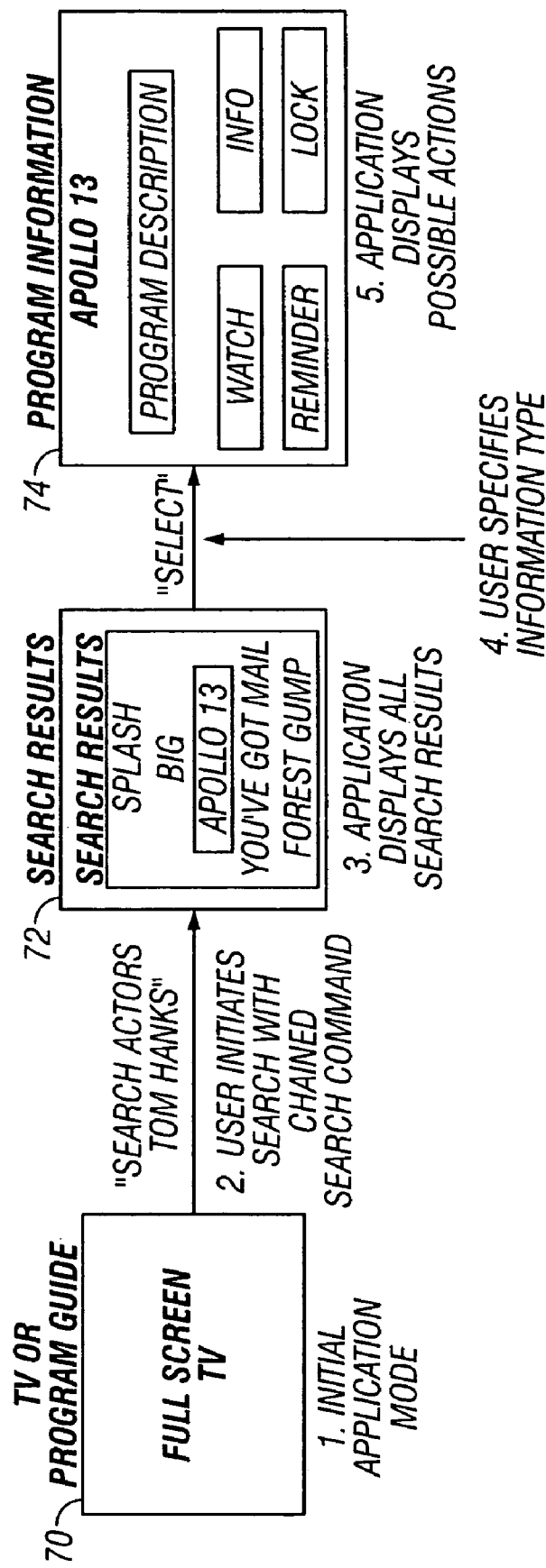
FIG. 7 is a block schematic diagram which shows one-step targeted search functionality according to the invention.

FIGS. 6 and 7 are block schematic diagrams which show targeted search functionality.

FIG. 6 shows a step-by-step targeted search:
1. Initial application mode 60.
2. User initiates search with search command.
3. Application displays all information types 62.
4. User specifies information type.
5. Application queries user for information item 64.
6. User specifies information item.
7. Application displays search results 66.
8. The user selects search results.
9. The application displays possible actions 68.

FIG. 7 shows a one-step targeted search:
1. Initial application mode 70.
2. User initiates search with chained search command.
3. Application displays search results 72.
4. Application displays possible actions 74.

The method and system described above has application in support of, for example, the following services:

Video-On-Demand services

Subscription-Video-On-Demand services

Everything-On-Demand services

Personal Video Recorder and Digital Video Recorder (PVR and DVR) appliances and services Delivery of streaming audio Delivery of information based services (News, Weather, Stocks, Reviews, Editorial, etc.)

Exemplary System

Figure 8:
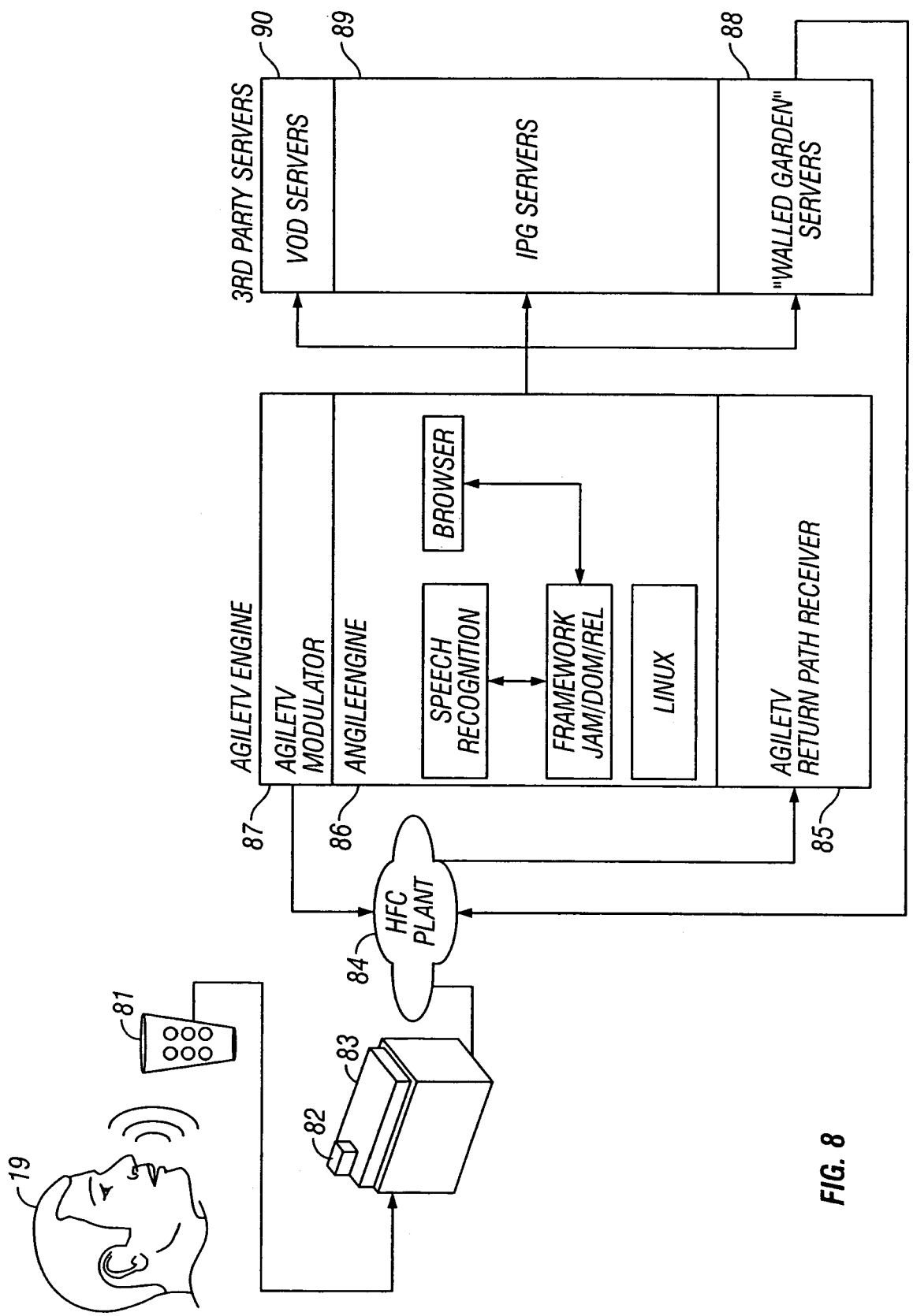
FIG. 8 is a block schematic diagram which shows a server centric speech control system overview, for example with which the invention may be implemented according to the invention.

FIG. 8 is a block schematic diagram which shows a server centric speech control system overview, for example with which the various embodiments of the invention discussed herein invention may be implemented. FIG. 8 is best understood when considered along with FIG. 1.

A user utters commands via a voice link remote 81. These commands are received at a voice link receiver 82, which in the presently preferred embodiment, is coupled to a cable television set top box 83. The commands are processed and forwarded via a hybrid fiber-coax cable plant 84 to a return path receiver 85, such as that provided by AgileTV of Menlo Park, Calif. A processor, such as a Linux-based processor 86, supports speech recognition and processes the user's utterances into recognizable commands. A path back to the user for a system response is provided by a QAM modulator 87, such as manufactured by AgileTV of Menlo Park, Calif. The system, responsive to user commands thus received, accesses various forms of content for presentation to the user, such as a video-on-demand server 90, an interactive program guide server 89, or a walled garden server 88 which provides the user with various Internet applications.

Personalization Process, Personalized Program Lineup, Recommendations, and Interactive Television Services This embodiment of the invention provides the use of personalization as a way to filter and deliver relevant content and services based on individual preferences. In turn, this limits the number of options faced by a user at any given point and simplifies the user experience. Voice recognition and the speech interface provide an intuitive way to navigate the interactive television interface and manage the thousands of options from which to choose.

The following steps are performed to provide a personalized experience to the individual television viewer:
1. Preference Profile—in which a personal preference profile is created. A preference profile is established based on a variety of input sources including settings managed by the user, as well as behavioral analysis that occurs automatically and is transparent to the user.
2. Identification—in which individual television viewers are identified based on unique vocal characteristics (speaker ID) or self-identification through use of a remote control and graphic user interface.
3. Preference Matching—in which an individual preference file is matched to the individual television viewer and used to filter available programming choices and/or interactive television services.
4. Presentation—in which the user interface, information services and/or programming choices are modified and personalized to the individual user based on the previous three steps.

Personalization Process Flow

Figure 9:
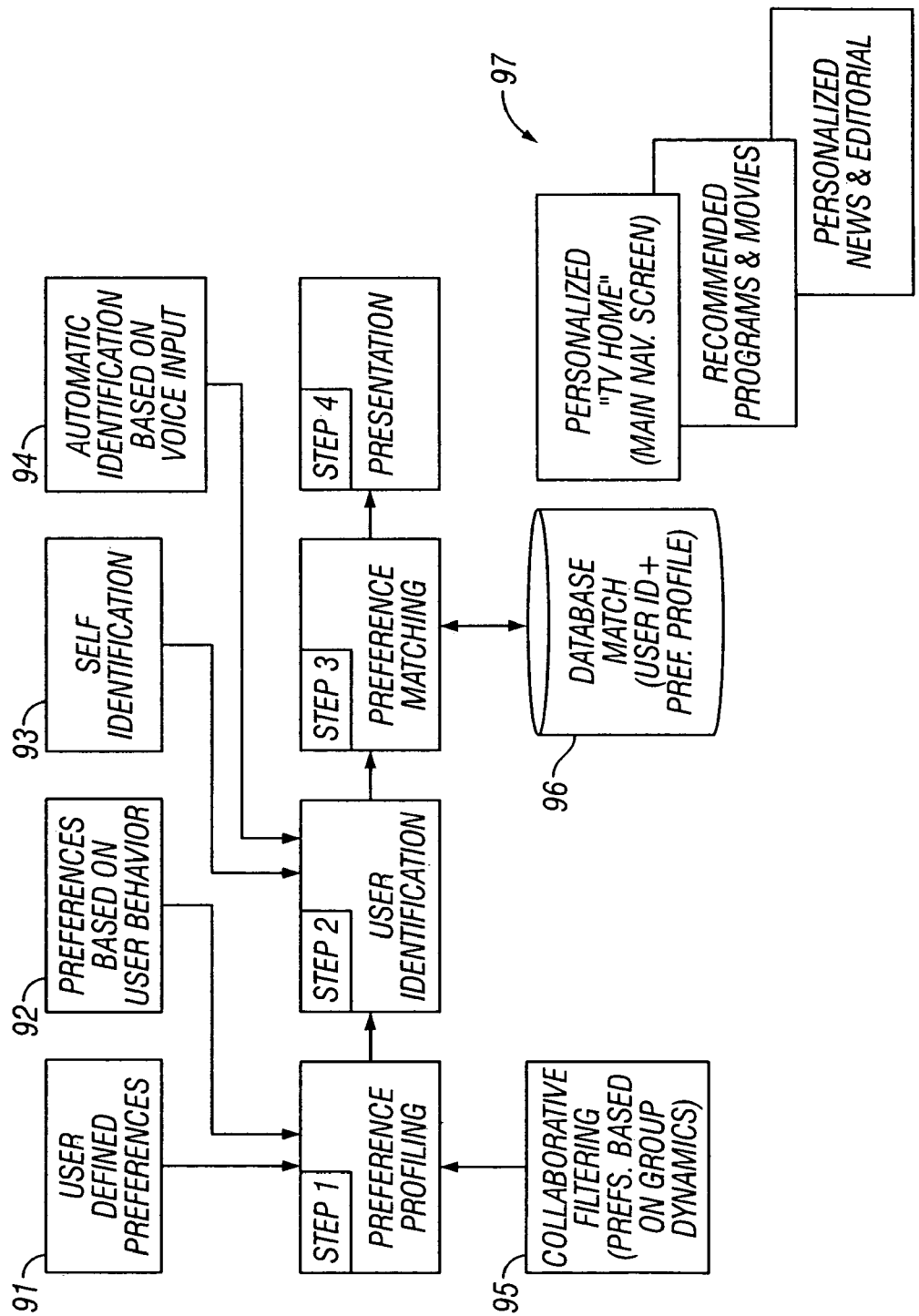
FIG. 9 is a block schematic diagram that shows a personalization process flow according to the invention.

FIG. 9 is a block schematic diagram that show a personalization process flow.

Step 1. Preference Profiling

To create a preference profile for an individual television viewer a variety of methods may be used, including the following:

User defined preference settings 91 in which the user self defines their profile by selecting favorite types of programs and/or attributes of programs. For example, users may choose a preferred subset of program categories, e.g. drama, sports, history, from a larger set as might be presented via a graphic user interface, menu system or settings selection screen. Users may also identify preferred programs based on popularity, e.g. Nielsen data, content ratings, e.g. G, PG, R, TVMA, etc., or quality ratings, e.g. 5-star Movies, also via graphic user interface. Options are controlled or selected by way of the voice user interface and/or remote control.

"Collaborative filtering" 95 in which individual preferences are automatically predicted based on viewing patterns and/or self defined user profile that identifies a user to have preferences in common with other groups of users. This is an automated process without exposure to the user that is controlled and managed in software.

Analysis of individual user behavior 92 based on frequency of program, channel and/or category request by way of the voice user interface.

Frequency with which specific scan categories are selected. For example, if a user frequently requests to "scan sports," then it is assumed the user prefers sports related programs. This then becomes part of the user's "Preference Profile."

Similarly, frequently requested programs or channels could be added to a "Preference Profile."

Step 2. Identification

Identification of an individual viewer may be accomplished in one of two ways:

Self-selection 93, in which the user identifies himself by selecting his individual profile via input from the remote control and the graphic user interface.

Automatic identification of the television viewer 94 based on individual vocal characteristics (speaker ID). Following an enrollment step, comprising capture of a suitable speech sample and association with an individual user, the process of identification may take place without explicit action on the part of the user, as part of processing a spoken command. Normal usage of the voice control interface provides sufficient acoustic information for speaker identification to take place.

Individual users that are not recognized may still be grouped by gender and/or distinguished as an adult or child. This coarser form of identification may also be used to personalize the interface and recommended program content.

Step 3. Preference Matching

Preference matching takes place once the individual user has been identified or grouped and a preference profile is matched to the user and activated. This is a simple database matching procedure 96.

Step 4. Presentation

Presentation of personalized information is the final step in which programming content and/or interactive television services are displayed for the individual user via the graphic user interface and controlled via speech recognition. Personalized programming content and information services may take the following forms:

Personalized and/or recommended program lineup in which current or upcoming programs and/or movies are grouped and presented based on personal preferences and speaker identification 97. This information is displayed on the television screen in the form of a selectable list with a variety of actions possible including obtaining more information for the selected item. Information is presented via the graphic user interface in the following screens:

Recommended program lineup for a given viewing session would be created and personalized based on the preferences of the individual. An example of this is a list of programs targeted to the user based on individual preferences that would air within the next few hours.

A list of movies appearing in the upcoming week is another embodiment of a recommended and personalized list.

Personalized information services in which news, reviews and a variety of textual and visual editorial content may be presented and organized based on personal preferences and speaker identification. This information is presented via the graphic user interface in the following screens:

Entertainment news:
  i. Breaking news stories about celebrities
  ii. Movie news, e.g. "What's in theaters now"

Personalized television "Home Page" in which a combination of recommended programming and editorial content (reviews, etc.) and advertising is presented to the television viewer.

The method and system described above also has application in support of the following services:
  Interactive Program Guides
  Video-On-Demand services
  Subscription-Video-On-Demand services
  Everything-On-Demand services
  Personal Video Recorder and Digital Video Recorder (PVR and DVR) appliances and services
  Delivery of streaming audio
  Delivery of information based services (News, Weather, Stocks, Reviews, Editorial, etc.)

Hierarchical User Interface for Speech-controlled Applications

This embodiment of the invention provides a hierarchical user interface for speech-controlled, interactive applications that provides television viewers with an intuitive and easy-to-use way to find the programs they want, and to control their television viewing experience. An interactive application is one in which more than one party is an active participant. For this disclosure, one of the parties is human and the other is a software application.

The hierarchical user interface provides modeless, ubiquitous, one-step access to information content and other application functionality via speech commands. It also discloses a graphical user interface that gives progressive disclosure to the same information content via input from more traditional sources such as a pointing device or remote control. Speech commands can also be used one at a time to follow the progressive disclosure path.

Each speech-controlled application uses a set of commands initiated by either speech or input from a more traditional device such as a remote control or pointing device. Speech commands are specified in a set of grammars. There are various publications describing how to construct a grammar, available from the VoiceXML Forum and other sources. For the purposes of this discussion, grammars contain a set of items. Each item contains a word or phrase that can be spoken, an associated set of attributes that provide more information about the item, and optionally, the name of a grammar that must be imported to complete the utterance. A grammar also has an associated set of attributes that provide more information about the grammar as a whole.

FIGS. 1 and 8 show the application environment. The steps shown in FIG. 1 are discussed above.

This embodiment of the invention allows information to be linked into a speech-accessible hierarchy. The hierarchy is implemented as a grammar. Any information or application functionality that should be ubiquitous, that is, available from any of the application screens or modes via speech commands, is described in grammars that are linked into the hierarchy.

Figure 10:
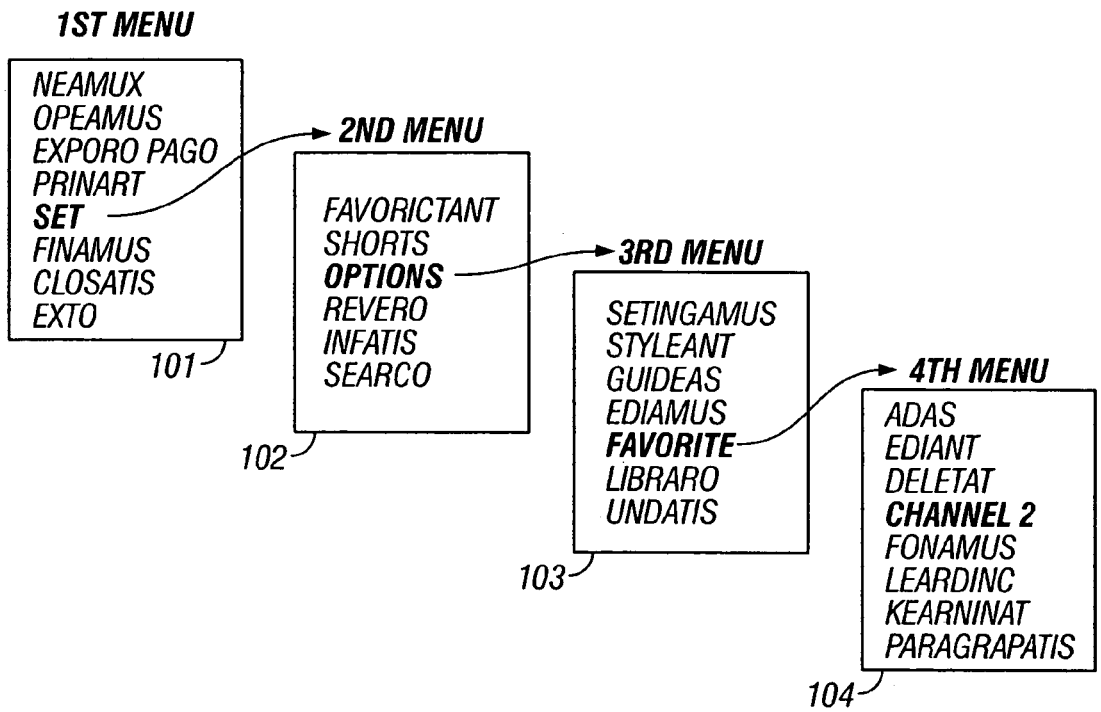
FIG. 10 is a block schematic diagram that shows a typical user interface for the path a user must follow to change a favorite channel setting.

The application then includes the hierarchy in the set of grammars activated by the Recognizer for any speech command. All of the speech commands contained in the hierarchy are then available from everywhere within the application. The reason for making commands ubiquitous is that it is frequently awkward to navigate to a user interface element with which the user wants to interact. The example in FIG. 10 shows a typical user interface for the path a user must follow to change a favorite channel setting, i.e. from a first menu 101, to a second menu 102, to a third menu 103 to a fourth menu 104.

Figure 11:
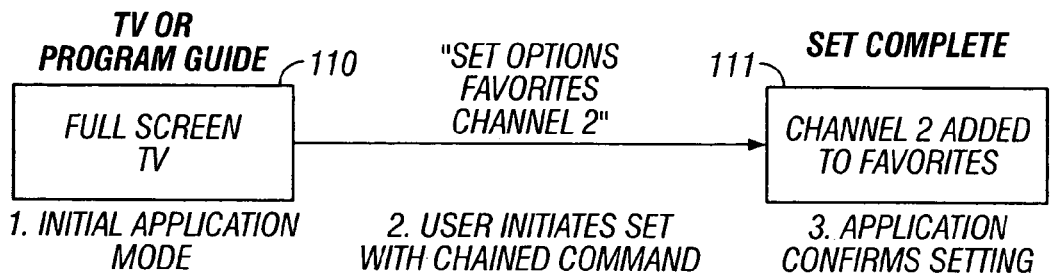
FIG. 11 is a block schematic diagram which shows an example user interface for a chained command according to the invention.

In a hierarchical user interface, application settings can be implemented as chained commands linked into a hierarchy, e.g. from anywhere in the application, "Set Options Favorite Channel 2" to add the favorite channel in a single step. FIG. 2, discussed above, shows an example set of chained grammars. When the user utters a chained command, the application can skip intermediate steps. An example user interface for this chained command according to the invention is shown in FIG. 11. In FIG. 11, the user is in an initial application mode 110. The user initiates a set with a chained options command, and the application confirms the setting 111.

The graphical user interface can be constructed to mirror the structure of the hierarchy so that there is a visual element representing each command in the chain. To reflect the hierarchy, the visual elements are usually disclosed one at a time. When the user engages one of these visual elements, the visual element representing the next level in the hierarchy appears. The menu example in FIG. 10 is one user interface for showing progressive disclosure, but it is optimized for traditional, menu-driven applications.

Figure 12:
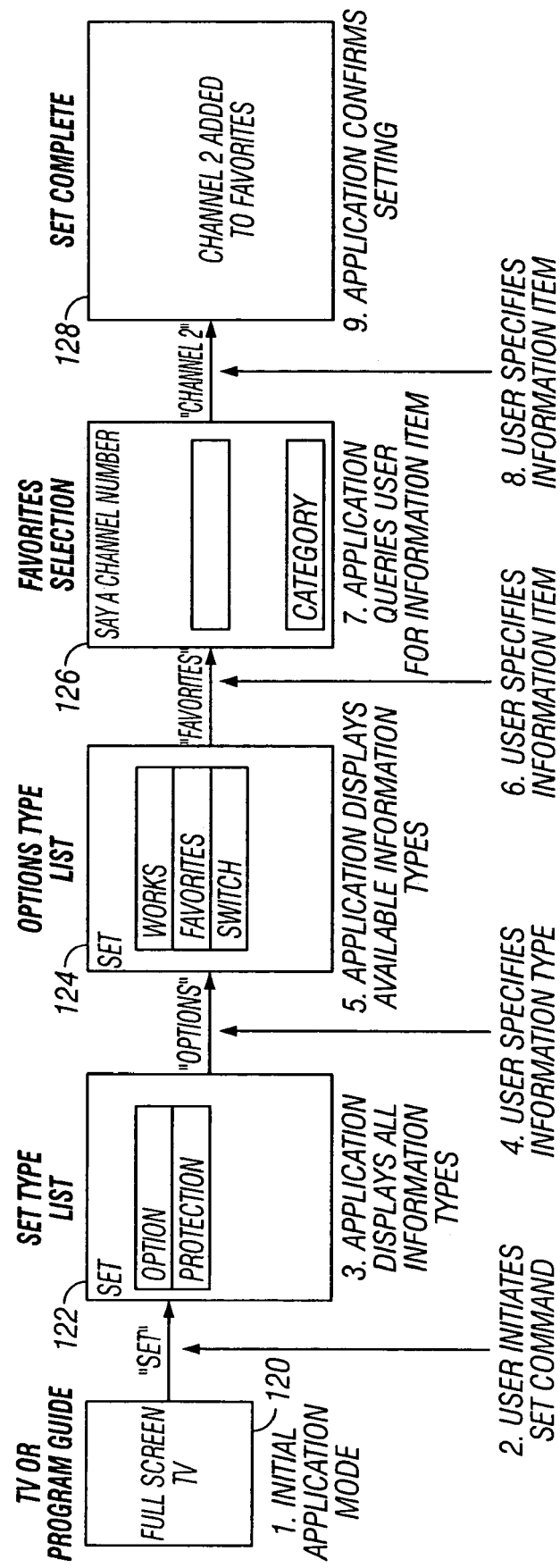
FIG. 12 is a block schematic diagram which shows an example user interface for step-by-step functionality in a speech-enabled television context according to the invention.

An example user interface for the same step-by-step functionality in a speech-enabled television context is shown in FIG. 12. In FIG. 12, step-by-step option setting using individual commands begins in the initial application mode 120. The user initiates a set command and the application queries the user for the type of information the user would like to set 122. The user specifies an information type, and the application displays a list of items of that type 124. The user specifies an item, and the application queries the user for an item value 126. The user specifies the item value, and the application confirms the setting 128.

The grammars can also be constructed to allow the user to speak each of the commands in the chain as an individual command. At each link in the chain, both the top-level hierarchical grammar and a grammar for the sub-hierarchy that begins with the keyword for this level must be in the set of grammars activated by the Recognizer.

Figure 13:
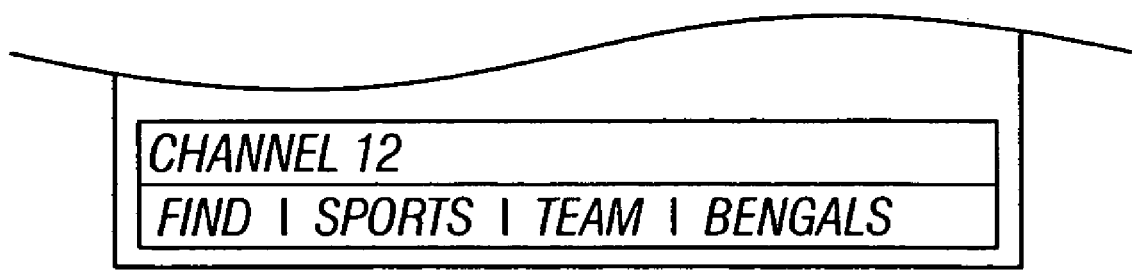
FIG. 13 is a pictorial representation of feedback which appears in the info bar according to the invention.

The visual elements representing the commands in a chain can take many different forms. They can be buttons, items in menus, or text in speech feedback given to the user. Each visual element should include the utterance used in the grammar so that when part of a chained command has been disclosed, the user can pick up where they left off in the chain. For example, if the user says "Find Sports" and then sees a visual element representing "Team," he can then say "Team Bengals." If these commands are spoken while the user is watching television, the feedback appears in an information bar, for example as shown in FIG. 13.

The hierarchical user interface also makes it easier for users to learn which speech commands are accessible in which application contexts.

The method and system described above also has application in support of the following services:
Exploratory Search
Targeted Search
Linked Navigation Paths

Dynamic Channel Lineup and Control Via Speech Commands

This embodiment of the invention provides for the channel lineup to be dynamic and changeable. That is, the list of available channels can be modified, in real time, to suit the preferences and usage of a particular subscriber.

A dynamic channel lineup allows the user to change the set of channels that are available to watch and to get program listings for. Channels can easily be removed and added to the channel lineup at any time using speech commands. The control of the dynamic channel lineup is immediate and modeless. That is, there is no need to change to a different mode or go to a particular setup screen to change the lineup. Control of a dynamic channel lineup could also be achieved with buttons.

Additionally, the control of the channel lineup allows both temporary and more permanent changes to the lineup. That is, some changes to the lineup can be engaged for a short period of time, such as one period of viewing, while other changes to the lineup remain in effect until they are disabled.

When a dynamic channel lineup is in effect and the user is watching TV, the channel navigation commands only show the channels within the dynamic lineup. When the user is in the program guide application, only listings for the channels in the dynamic lineup are shown.

There are five methods of controlling a dynamic channel lineup:
1. Personal Channel Lineups
2. Category Channel Lineups
3. Channel, Program, Rating, and Category Blocks
4. Atrophying Unwatched Channels
5. Channel Lineup Reset Personal Channel Lineups By using the personal profiling and speaker identification technologies, individual users can create and use a personal channel lineup. This personal channel lineup is activated when the user issues the appropriate command, e.g. "show my channels." If the user is enrolled in speaker identification and/or has a personal profile, the channel lineup is specific to that particular user. If the user is not enrolled in speaker identification or does not have a personal profile, a default, household channel lineup is activated.

Once the personal channel lineup is activated, only the channels that are included in the lineup are available. A user may add or remove channels from the personal lineup by issuing the appropriate commands, e.g. "add HBO", "remove QVC."

Particular programs can also be added to the personal lineup, in which case the associated channel is temporarily added to the personal lineup for the duration of the program.

Category Channel Lineups

A category channel lineup is created using particular categories of programs. The user activates the category channel lineup by issuing the appropriate command and a category name, e.g. "show movie programs." Once the category lineup is in effect, only channels that are currently airing programs of the specified category are available.

Different types of program categories include:
Genre
Recommendations, based on:
Star ratings
Trusted sources
Program popularity
New releases Of particular interest is a channel lineup comprised only of child-appropriate content. This channel lineup, called "Kids only," consists of programs from child-related genres with an appropriate TV rating. The "Kids only" lineup acts as a default parental control. Parents need only to say the command, e.g. "Show Kids only," to activate the Kids only lineup.

Category channel lineups may also consist of combinations of categories. Those categories may be related, such as family and comedy, or unrelated, such as baseball and fishing.

Channel, Program, Rating, and Category Blocks

There are four different methods of removing ("blocking") programs and channels from a dynamic lineup:
by channel,
by program,
by rating, or
by category.

Each method, described below, either permanently or temporarily makes a channel unavailable while watching TV or viewing listings in the program guide application.

A particular channel may be globally removed from a dynamic channel lineup. When the Block command and the channel name, e.g. "block HBO," is given, the specified channel is no longer available while watching TV or viewing listings in the program guide. Any channel may be blocked at any time, regardless of whether or not the channel is currently tuned to or selected with the program guide.

Channels may be unblocked by issuing the Unblock command and the channel name, e.g. "unblock HBO."

Programs can be blocked using a similar mechanism as described above. When a program is blocked, e.g. "block Sex in the City," the channel that it is airing on is unavailable for the duration of the program. As with channels, programs may be unblocked with the appropriate command ("unblock Sex in the City").

Programs can also be blocked by a specified category, such as "adult" or "shopping," or by a specified MPAA or TV rating, such as "PG-13" or "TV-R." Category and rating blocks temporarily remove channels from the dynamic lineup when programs that match the category or rating are airing or are within the current program guide time slot. The channels remain unavailable for the duration of the program.

Blocks can either be persistent across other dynamic channel lineups, such as personal lineups or category lineups, or can be set independently within a personal channel lineup.

Atrophying Unwatched Channels

If channels are never watched for a particular time interval, such as four weeks, they can automatically be removed from the dynamic channel lineup. This control can also be forced by the user with the appropriate command, e.g. "remove unwatched channels."

Channel Lineup Reset

The dynamic channel lineup can also be reset, causing all channels to become available. This global reset is activated by issuing the appropriate command ("reset all channels").

The channel lineup reset may also be selectively applied to a personal channel lineup with a different command ("reset my channels").

Figure 14:
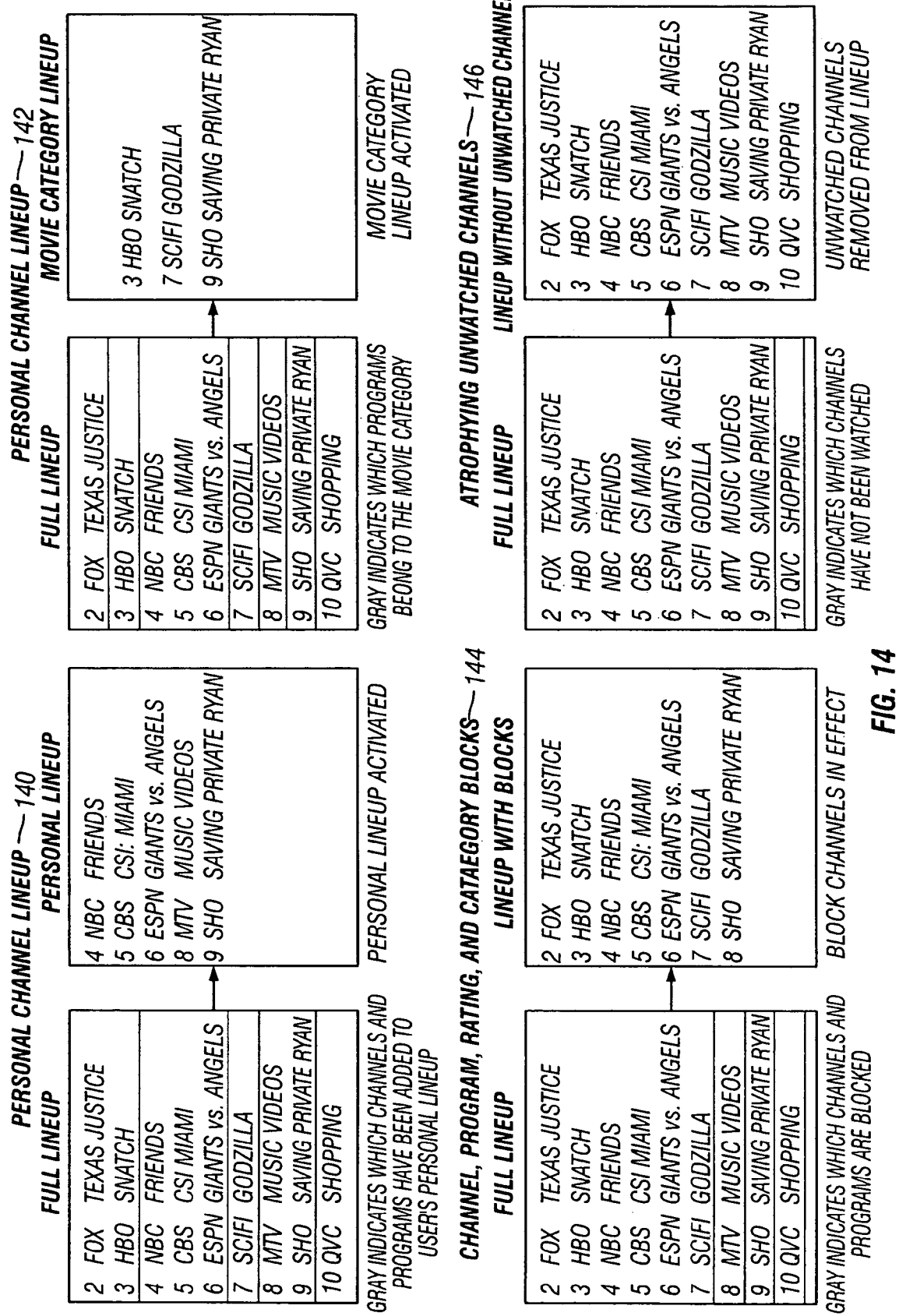
FIG. 14 is a block schematic diagram that provides an illustration of dynamic channel lineup functionality according to the invention.

FIG. 14 is a block schematic diagram that provides an illustration of dynamic channel lineup functionality. Shown in FIG. 14 are examples personal channel lineups 140, category channel lineups 142, channel, program, rating, and category blocks 144, and atrophying unwatched channels 146. In each example, the full lineup is shown on the left of the figure and the dynamic lineup is shown on the right of the figure. Further, items that have been dynamically removed from the full lineup are shown in the full lineup in gray.

Advertising Directed by Speaker Identification, Group Identification, Language Identification, Speaker Emotional State, or General Speech Characteristics This embodiment provides a method and apparatus that addresses the use of speaker, group, language, or emotional state identification systems to target advertising, to either enrolled or unenrolled users of a content presentation system. The invention pertains to improving the effectiveness of electronic advertising, typically though not exclusively when presented to the consumer via television, or via a computer connected to the Internet. Specifically, the invention applies to the case where this presentation medium, i.e. the television, Internet-connected computer, etc., is controlled by spoken command.

Control by spoken command may be achieved through use of a speech recognition system, which processes an electronic representation of an audio signal, uttered by the user, into corresponding text, or into an associated signal that controls the presentation medium, i.e. tuning the television to a selected program, or causing the Internet-connected computer to display a selected Web page. It is key that the same information that is present in the audio signal, which can be processed to determine the spoken words or command, can also be used to determine the identity of the speaker. This latter determination is made by a speaker identification system.

Figure 15:
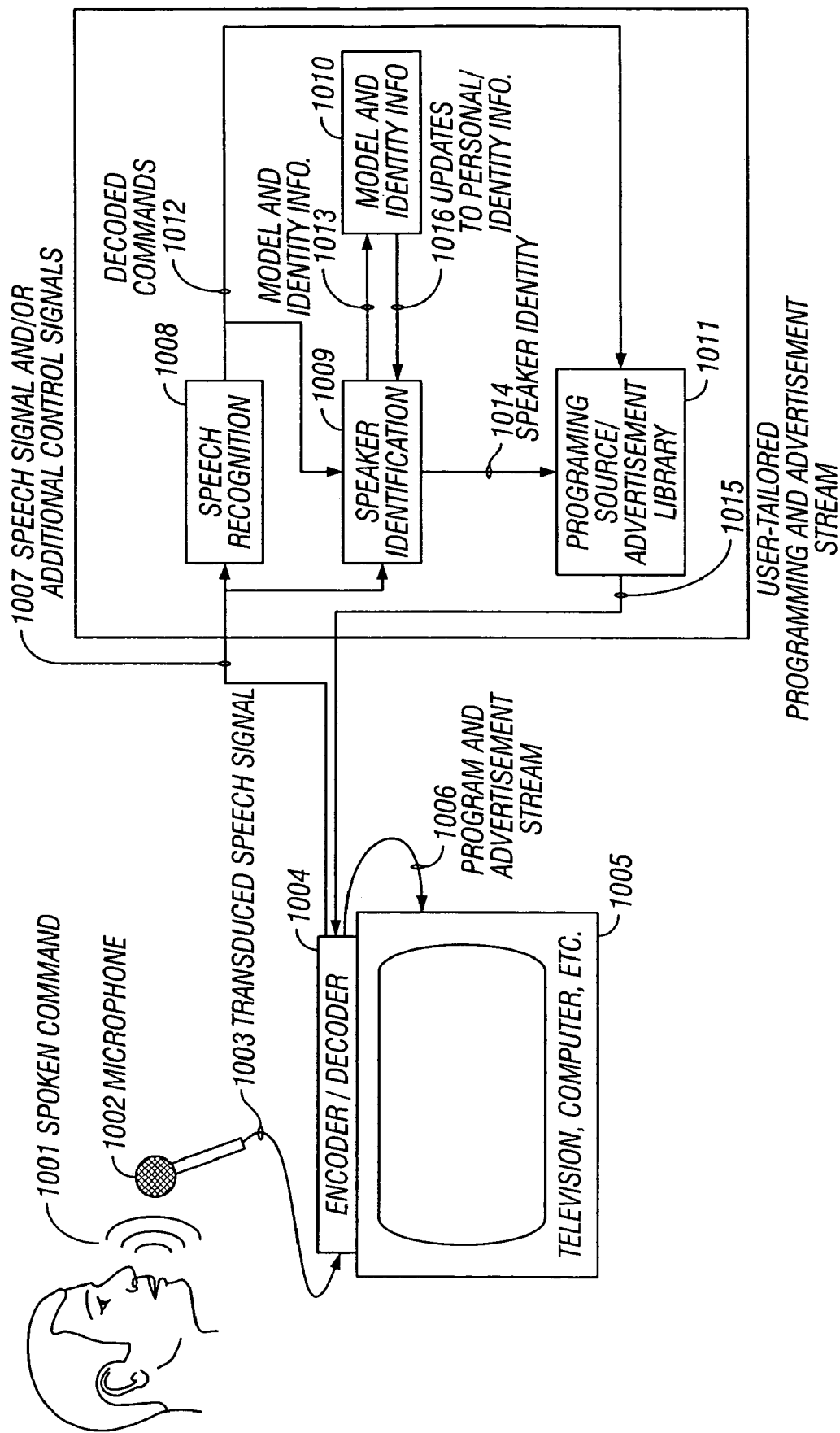
FIG. 15 is a block schematic diagram that shows a general system context for an embodiment of the invention in which advertising is directed to an individual by speaker identification, group identification, language identification, speaker emotional state, or general speech characteristics.

The general context of this invention is shown in FIG. 15, which is a block schematic diagram that shows general system context. Those skilled in the art will appreciate that the functionality necessary to implement this embodiment of the invention may be provided at any appropriate location within a system. Accordingly, the following discussion is in no way tended to limit the scope of the invention. This figure shows the variety and flow of information present in the system, and exhibits the processing of a given utterance 1001 to control both the program and advertisement stream 1006. In FIG. 15, the speaker command passes through a signal path that includes a microphone 1002 which produces a transduced speech signal 1003, which signal is coupled to an encoder/decoder 1004 associated with a television or personal computer 1005. The encoder/decoder presents a program and advertisement stream 1006 to the television/personal computer and outputs a speech signal and control signals 1007 to a speech recognition system 1008 and speaker identification system 1009, which output decoded commands 1012 and speaker identity 1014, respectively. A database containing models and identity information 1010 is queried by the speaker identification module, and as well receives update information there from 1016; and provides model and identity information 1013 responsive thereto. Speaker identity information thus derived from the speech signal, and decoded commands, are provided to a programming source and advertisement library 1011, resulting in a stream of user tailored programming and advertisements 1015 which are sent to the encoder decoder for display to the user.

Typically, though as detailed below not exclusively, a person wishing to use a speaker identification system.(also known as a speaker ID system) first provides a sample of his speech, and associates this speech sample with his personal identity, i.e. a name, credit card number, or other personal information. This process is known as enrollment. Thereafter, when the enrollee speaks to the speech processing apparatus, both the text corresponding to the utterance, and the identity of the speaker, is determined by the combined operation of the speech recognition and speaker identification systems. The mathematical representation of the enrollment data, which may be used to identify the speaker, is called a speaker identification model.

Figure 16:
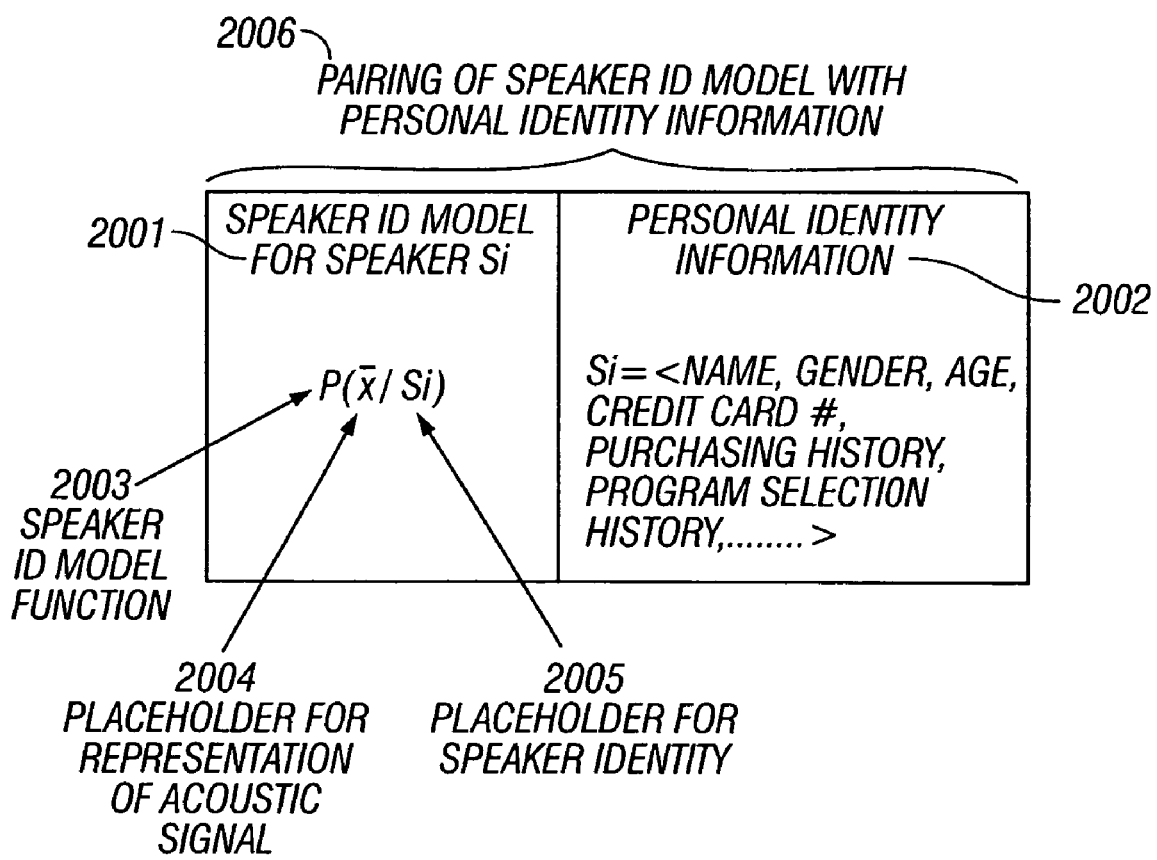
FIG. 16 is a block schematic diagram which shows a general structure of the pairing of a speaker identification model with personal identity according to the invention.

The general structure of the pairing of a speaker identification model with personal identity is illustrated in FIG. 16, which shows a general speaker identification model and personal identity structure. The speaker identification model 2003 is a mathematical function, which takes as input a representation 2004 of a given utterance, and a placeholder for a particular speaker 2005 and returns a real number, the value of the function, which is the likelihood that the given utterance was spoken by the particular speaker. The speaker identification model thus described 2001 is combined with personal identity information 2002 to provide a pairing of the speaker identification model with the personal identity information 2006.

The appeal of a speaker identification system is that it provides a secure and easy means for a user to authorize and control access to the presentation medium in question (television, computer, etc). Thus the user is likely to wish to enroll.

Figure 17:
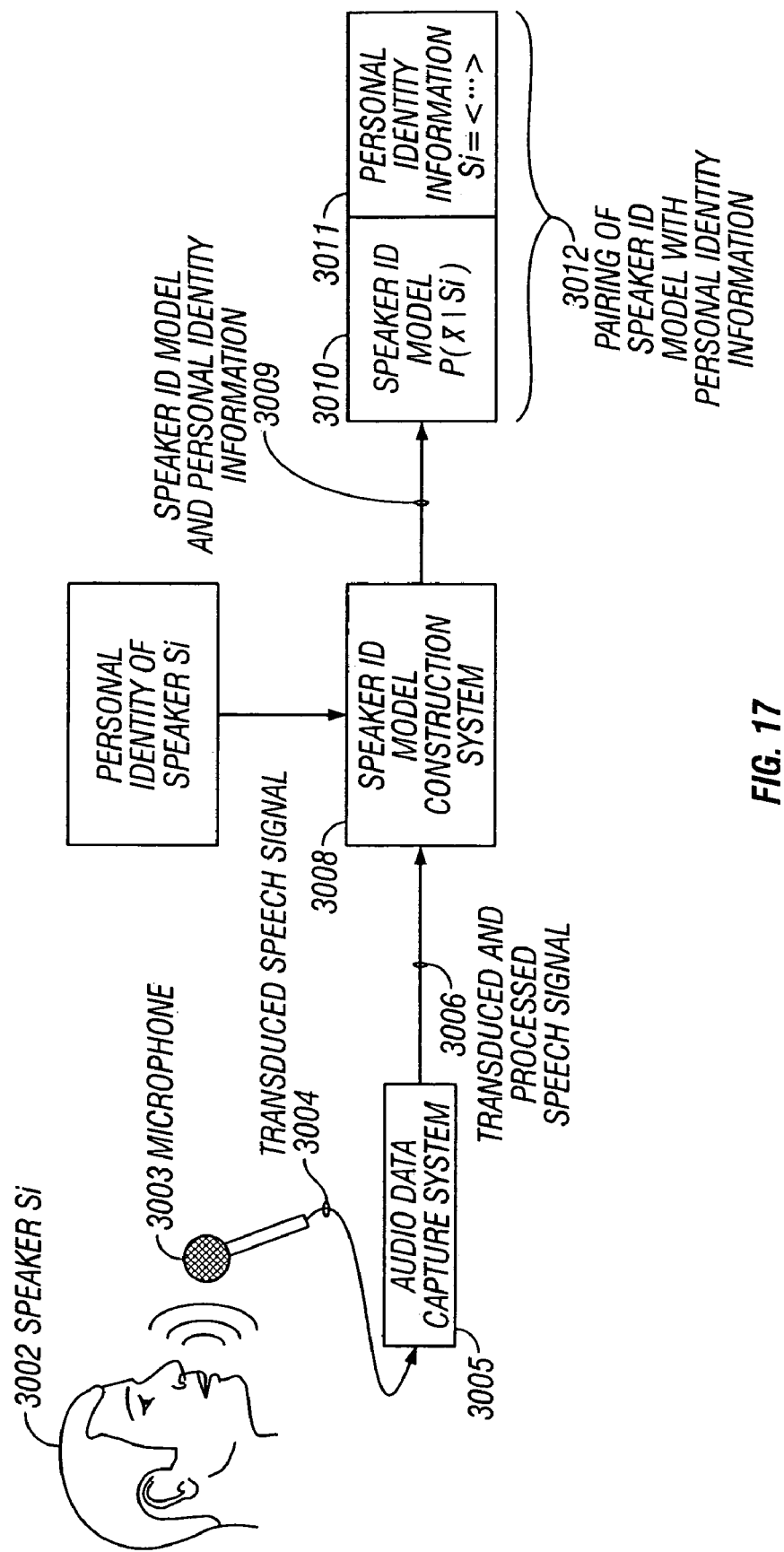
FIG. 17 is a block schematic diagram which shows the speaker ID enrollment process according to the invention.

FIG. 17, Speaker ID Enrollment Process, is a block schematic diagram which illustrates the process whereby a speaker 3001 supplies an enrollment speech sample or samples 3002, to a microphone 3003, which is transduced into a speech signal 3004, provided to an audio data capture system 3005, transduced and processed in a speech signal and, along with the personal identity model of the speaker 3007, is applied to a speaker model construction system 3008. The resulting speaker identity model and personal identity information 3009 is then processed into a speaker identity model 3010. As discussed above, this model is paired with personal identity information 3011, obtained by some other means, and the pair 3012 is stored for future reference.

It is important to note that, after enrollment, a user's command utterance provides both command and control information, for example, selection of the program that the television is to tune to, and also the identity of the speaker. No special action by the user is required after the enrollment stage. The identity of the speaker is determined and reconfirmed with each command utterance. This identification is performed for each utterance, in a manner that is transparent to the user.

Figure 18:
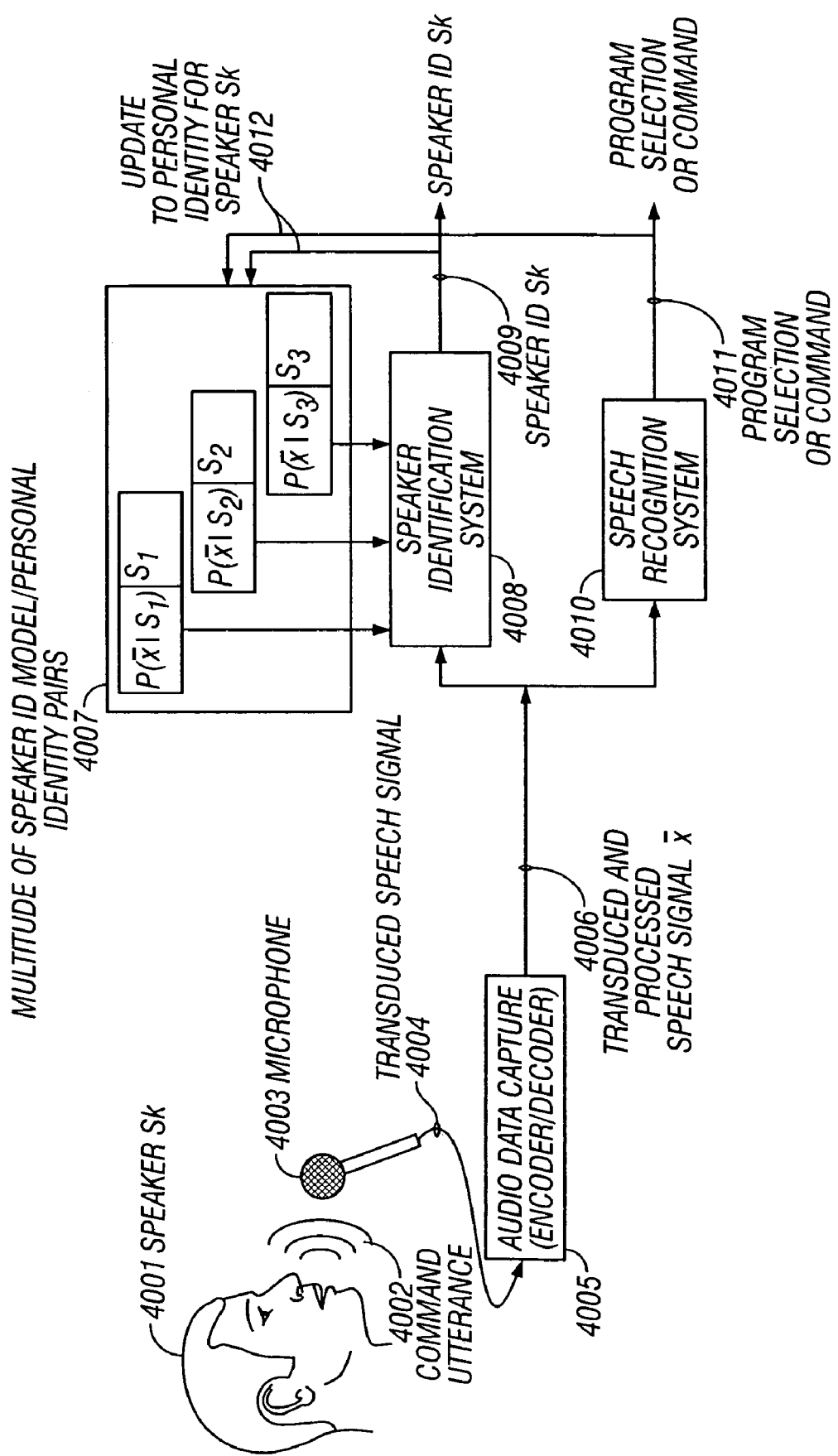
FIG. 18 is a block schematic diagram which illustrates the simultaneous determination of both speaker identity and program selection or command information from one and the same utterance according to the invention.

FIG. 18, Operation of Speech Recognition and Speaker ID Systems, is a block schematic diagram which illustrates the simultaneous determination of both speaker identity 4009 and program selection or command 4011 information, from one and the same utterance 4002. When the speaker 4001 makes an utterance 4002, the utterance is received at a microphone 4003 which produces a transduced speech signal 4004. The speech signal is coupled to an audio data capture facility 4005, such as an encoder/decoder, and the transduced and processed speech signal 4006 is routed to a speaker identification system 4006 and a speech recognition system 4010. The speech recognition system produces program selection and/or command information 4011, which is both output and which is also routed to one or more speaker identification model/personal identity pairs 4007 as update information 4012.

Users who have participated in the enrollment process are referred to as enrolled speakers. All others are referred to as unenrolled speakers.

Problem Identification

One problem addressed by this invention is improving the effectiveness of electronic advertising. Advertising in general is a mass medium, which is to say that its message is widely disseminated throughout the consumer population. As such, it is inefficient, because the advertiser pays to blanket the entire audience with a commercial or political message, whereas only a small fraction of the audience may have the means or desire to respond to the message. For instance, a political message impelling voters to elect this or that candidate is wasted on viewers of the advertisement who are too young to vote.

For this reason, advertisers typically aim to promote their products or ideas through a means that is watched or used by a population that most closely matches the intended recipient of the advertising message. Thus, children's toys are advertised on television programs that are watched by primarily by children, beer commercials are shown on sports programs, and so on.

However, this selection mechanism, which is based on the general demographic appeal of the content being viewed, is less refined than might be desired. This embodiment of the invention provides a method for achieving far higher accuracy and precision in targeting of advertising.

Exemplary Embodiment

The exemplary embodiment of the invention consists of targeting advertising content to individual users, as determined by the speaker identification system. In the context associated with this invention, the speech recognition system is used to select the content that the user wishes to experience, i.e. a television program, an audio stream of a particular genre, and so on. The pauses or interruptions present in this program or stream may then be filled with advertising messages that are targeted to the characteristics of the individual user who made the program selection.

This system permits the targeting of advertising by age, gender, income level, residential address, and other information that is highly pertinent, from the advertiser's point of view. This is because the speaker ID enrollment process typically, though not necessarily, links the user's audio sample with pertinent demographic or financial information, such as age, gender, home address, credit card number, and so on. Thus, for example, it would be possible for advertisers to ensure that their message is viewed by all households, and only those households, where an adult with a credit card credit debt limit of $10,000 or more is currently watching the television.

Discussion, Refinement and Extensions

The following are alternative embodiments of the invention, as presented above.

Targeting of Advertising without Speaker Identification Enrollment.

The system as described above assumes that an individual user has performed speaker ID enrollment, as defined in the opening paragraphs of this disclosure. However, it is possible to apply the same general idea in the absence of enrollment. This is because it is frequently possible to make an approximate determination of a speaker's age and gender, even absent an enrollment process. This mode of usage does not provide the individual targeting described above, but it still provides some of the audience focus that an advertiser seeks.

Targeting in the absence of enrollment is achieved by collecting samples of speech of adult males, adult females, adolescent males, adolescent females, and so on from the general population, and then building a general adult male speaker identification model, a general adult female speaker identification model, and so on.

Figure 19:
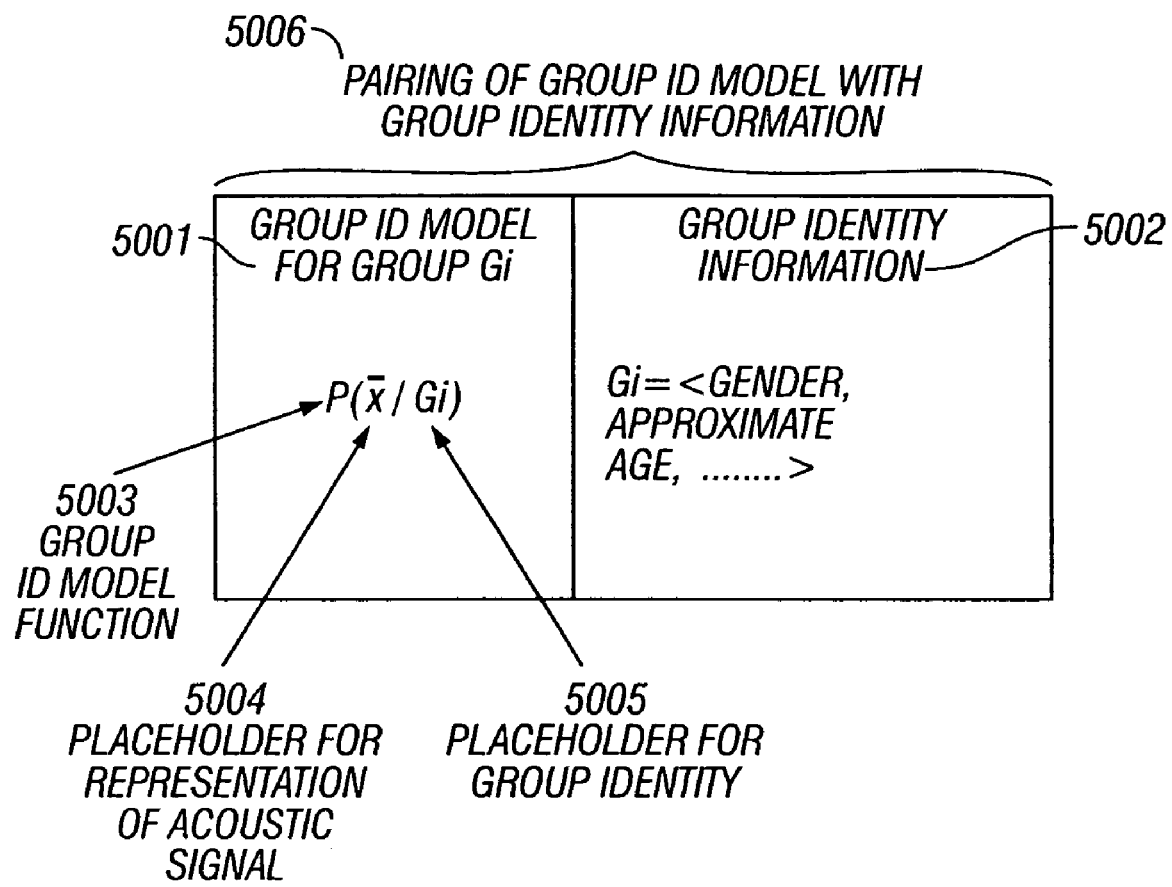
FIG. 19 is a block schematic diagram which illustrates the pairing of a group identification model with group identity information according to the invention.

FIG. 19, General Group Identification Model and Group Identity Structure, is a block schematic diagram which illustrates the pairing 5006 of a group identification model 5001, comprising a group identification model function 5003, a placeholder for a representation of an acoustic signal 5004, and a placeholder for a group identity 5005, with group identity information 5002.

Figure 20:
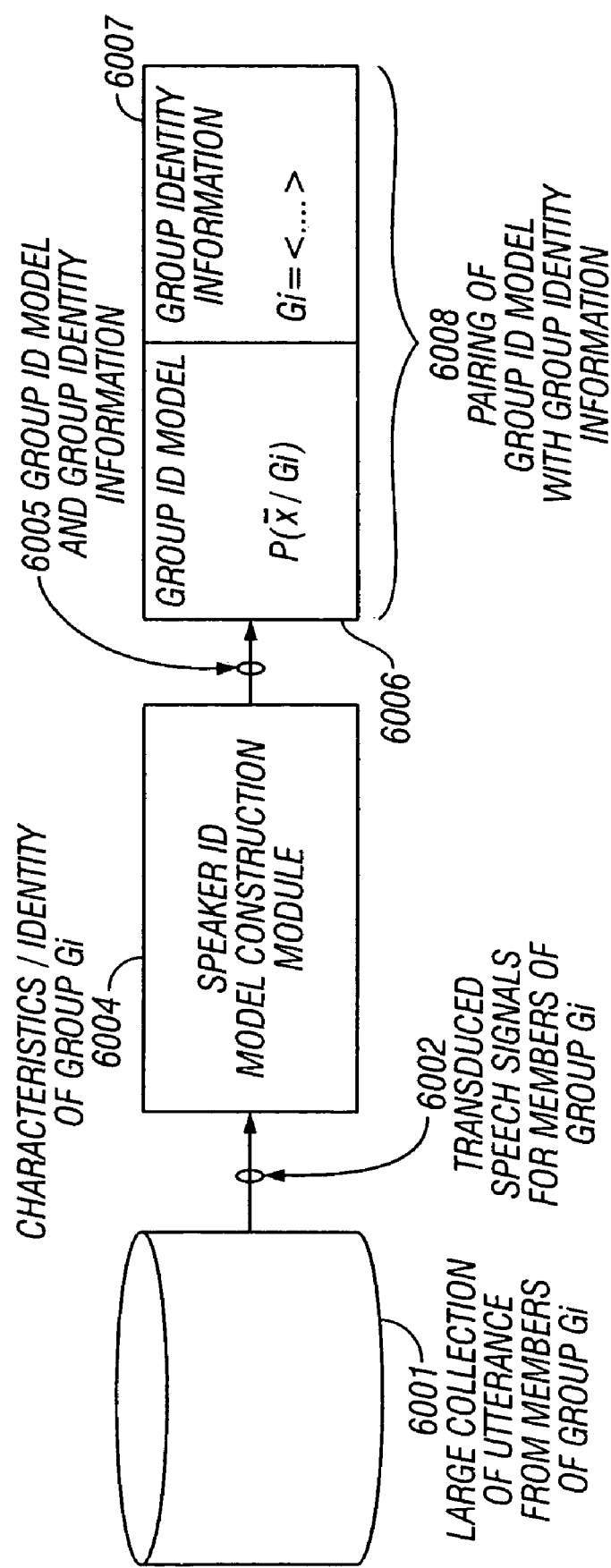
FIG. 20 is a block schematic diagram which illustrates the construction of a group identity model from a large collection of utterances from members of that group according to the invention.

FIG. 20, Construction of Group ID Model, is a block schematic diagram which illustrates the construction of a group identity model 6006 from a large collection of utterances 6001 from members of that group. A speaker identification model construction module 6003 receives information on the characteristics and identity of a group 6004 and transduced speech signals for members of the group 6002 and produces therefrom a group identification model and group identity information 6005, resulting in a pairing of the group identification model with group identity information 6008. In operation, the model that matches an utterance from some unenrolled user most closely is then used to provide a guess as to the user's demographic characteristics.

Figure 21:
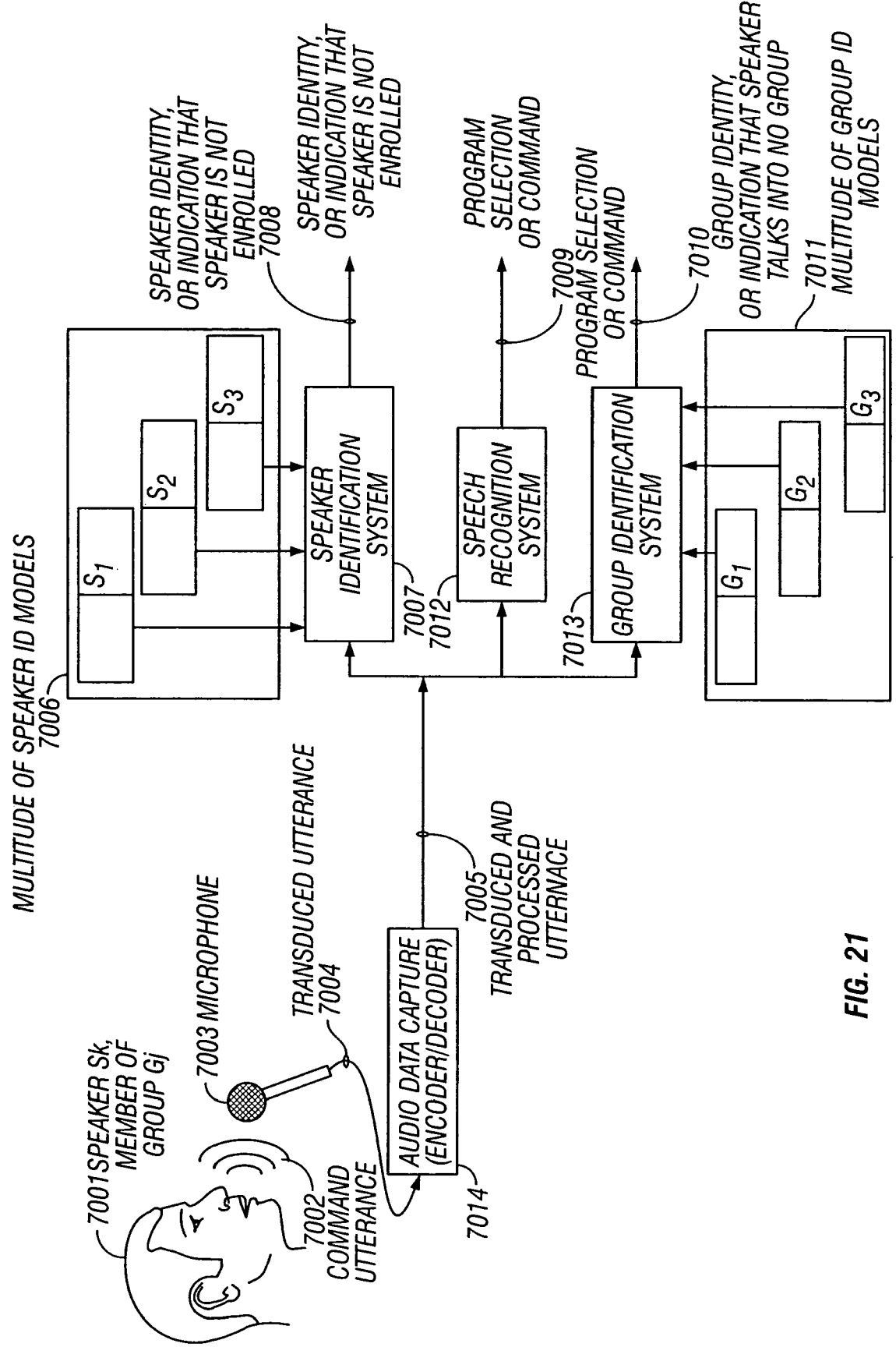
FIG. 21 is a block schematic diagram which shows simultaneous operation of speech recognition, speaker identification, and group identification systems according to the invention.

As indicated in FIG. 21, which is a block schematic diagram which shows simultaneous operation of speech recognition, speaker identification, and group identification systems, both enrolled and unenrolled modes of operation may be invoked simultaneously. If the speaker identification system 7007 indicates that the speaker is not enrolled, then the result 7010 of the group identification system 7013 may be used, to provide a less refined means of targeting advertising. In FIG. 21, a speaker 6001 makes utterances 7002 which are received at a microphone. 7003 and routed as transduced utterances 7004 to an audio data capture module 7014, such as an encoder/decoder. The audio capture module outputs the transduced/processed utterances 7005 and provides same to a speaker identification system 7007 comprising multiple speaker identification models 7006, and which produces an output comprising speaker identity or an indication that the speaker is not enrolled 7008; a speech recognition system 7012, that produces an output comprising a program selection or a command; and the group identification system 7013, which comprises a multitude of group identification models 7011, and which produces an output which comprises group identity or an indication that the speaker does not fall into an identifiable group.

Targeting of Advertising Based upon Emotional State.

By analyzing a spoken utterance for pacing, stress patterns, spectral distribution of acoustic energy and other elements, it is possible to make an approximate determination of a user's emotional state. Again, this can be valuable information to an advertiser. An individual who is agitated could be shown advertisements for stress-reducing products (herbal teas, spa visits, vacations, and so on). Those in an emotional state that is associated with an increased propensity to make major purchases could be shown advertisements for expensive or luxury items.

Targeting of Advertising Based upon Language.

In a further extension of this idea, it is possible to determine, again by analysis of the acoustic signal, the language in which a given utterance is spoken (English, Spanish, Hindi, etc). When the language of the speaker has been identified, an advertisement in that same language, and/or with content targeting speakers of that language, may then be presented to the user, at an appropriate interval. Thus for instance, Spanish speakers may be presented a Spanish-language version of an automobile commercial, or Hindi speakers may be presented advertisements for reduced-price air fares to and from the Indian subcontinent.

Combination with other Modes of Demographic Targeting.

It is well-known that the audience of particular television programs, or the users of particular Internet sites, may constitute a population segment that is sought by a particular advertiser. Indeed, this is the basis for many current techniques for demographic modeling. In a further extension of these ideas, by tracking the television program or website selections of an individual user, where that user has enrolled in the speaker identification system, and it is permissible by statute or explicit granting of permission by the user for this information to be recorded, it is possible to create an even more detailed demographic portrait of the user. Thus for instance, it would be possible for an advertiser to target all 35-to-45-year-old males who are frequent viewers of the television programs The West Wing and E.R.

Use of Blind (Unenrolled) Individual Speaker Identification.

As observed above, in general a speaker identification system requires that a user participate in an enrollment process, to capture a sample of the user's speech, and associate it with personal identity information. However, given sufficient acoustic data, captured through ordinary operation of the system by spoken command, as opposed to explicit enrollment, it is possible to distinguish among the individual users of the system, and build speaker identification models for them. These models do not have explicit personal identity information associated with them, by which is meant name, credit card number, etc. However, they nevertheless function to distinguish one frequent user of the system from another. Note that this differs from merely identifying the group to which a speaker belongs, as discussed above in connection with Targeting of Advertising without Speaker Identification Enrollment.

With this identification in hand, and to the extent that it is permissible by statute or explicit granting of permission by the user for this information to be recorded, a television or Internet selection history for such individual users may be created. This may be supplemented with a plausible guess of the user's gender, approximate age, and so on, by the methods previously described. In this way, a detailed demographic portrait of an individual user may be created, even absent explicit enrollment in the speaker identification system.

General Speech Characteristics.

To the extent that any other desirable identifying characteristic, from the standpoint of efficacy of advertising, may be extracted from a speech signal, this system may be extended to incorporate use of that characteristic, for the purpose of targeting advertising.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A method for linking grammars into a hierarchy of operations, comprising the steps of:
established various grammars each grammar including various utterances and, for each utterance, the following associated attributes: (1) an indication of whether the utterance is explicitly chained to a further grammar, or (2) contextual information indicating a type of data implicitly specified by the utterance;
where each one of the various grammars further includes, for each utterance that is explicitly chained to a further grammar, a chained command attribute identifying the further grammar for activating responsive to a user issuing that utterance while said further grammar is activated for speech recognition;
where the various grammars include command grammars and information-type grammars, and:
utterances in the command grammars form commands to control a manner of presenting video programs;
utterances in the information-type grammars form keywords pertaining to content of video programs;
accepting a statement comprising a series of uninterrupted user utterances containing more than one user command for controlling a video program; and
performing a series of operations by activating a chained series of one or more grammars recognized from the statement, wherein for each grammar that contains a user utterance that is explicitly chained to a further grammar, activating the further grammar; and for each grammar that contains a user utterance having contextual information associated within, determining which options to make available to user next, thus activating a further grammar based on the contextual information of a preceding grammar, wherein the further grammar at least partially includes the options.

2. The method of claim 1, further comprising operations responsive to receiving an utterance in a given information-type grammar while said given grammar is activated for speech recognition, comprising:
if said given grammar lacks an indication that the utterance is explicitly chained to a further grammar, processing said utterance based on (1) application context of a user-driven system for presenting video programs and (2) type of data specified by the received utterance according to the given grammar.

3. The method of claim 1, the type of data indicated by the contextual information in information-type grammars is selected from among program name, genre, actor, director, writer, episode, date, popularity, quality rating, subject matter rating.

4. The method of claim 1, wherein the utterances comprise user defined preference settings.

5. The method of claim 4, wherein the user defined preference settings are selected from among a subset of program categories, a popularity requirement, a parental-warning type rating, and a quality requirement.

6. The method of claim 1, further comprising:
deducing predicted preferences from the various utterances, wherein the predicted preference settings are defined by processes selected from among a viewing pattern analysis, a user profile analysis, an analysis of user behavior relating to frequency of content requests by way of utterance.

7. The method of claim 6, wherein the predicted preference settings are added to a user defined preference setting.

* * * * *